US006661088B1

United States Patent
Yoda et al.

(12) United States Patent
(10) Patent No.: US 6,661,088 B1
(45) Date of Patent: Dec. 9, 2003

(54) SEMICONDUCTOR INTEGRATED CIRCUIT DEVICE HAVING INTERPOSER AND METHOD OF MANUFACTURING THE SAME

(75) Inventors: Takashi Yoda, Machida (JP); Hirokazu Ezawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 99 days.

(21) Appl. No.: 09/669,724

(22) Filed: Sep. 26, 2000

(30) Foreign Application Priority Data

Sep. 27, 1999 (JP) .............................. 11-273215

(51) Int. Cl.[7] .......................................... H01L 23/053
(52) U.S. Cl. .................. 257/700; 257/778; 257/734; 257/737; 257/738; 257/784; 257/785
(58) Field of Search .................. 257/778, 784, 257/734, 737, 738, 785, 700

(56) References Cited

U.S. PATENT DOCUMENTS

| | | | |
|---|---|---|---|
| 4,688,151 A | * | 8/1987 | Kraus et al. |
| 4,811,082 A | | 3/1989 | Jacobs et al. |
| 5,500,559 A | | 3/1996 | Miyata et al. |
| 5,656,542 A | | 8/1997 | Miyata et al. |
| 5,885,891 A | | 3/1999 | Miyata et al. |
| 5,912,507 A | * | 6/1999 | Dunn et al. |
| 6,002,168 A | | 12/1999 | Bellaar et al. |
| 6,075,710 A | * | 6/2000 | Lau |
| 6,246,247 B1 | * | 6/2001 | Eldridge et al. |
| 6,288,451 B1 | * | 9/2001 | Tsao |
| 6,332,782 B1 | * | 12/2001 | Bezama et al. |
| 6,339,254 B1 | * | 1/2002 | Venkateshwaran et al. |
| 6,461,895 B1 | * | 10/2002 | Liang et al. |

FOREIGN PATENT DOCUMENTS

EP          0 520 841 A1    12/1992

* cited by examiner

*Primary Examiner*—Fetsum Abraham
(74) *Attorney, Agent, or Firm*—Finnegan, Henderson, Farabow, Garrett & Dunner, L.L.P.

(57) ABSTRACT

A semiconductor integrated circuit device has a semiconductor chip, interposer, and substrate. The semiconductor chip has a plurality of first pads arranged at first pitches on a surface. The interposer has a first surface and a second surface. On the first surface, a plurality of second pads are arranged at the first pitches. On said second surface, a plurality of third pads arranged at second pitches which are larger than the first pitches. The second pads and the first pads are connected to each other by joining the first surface of the interposer to the surface of the semiconductor chip so as to face each other. The substrate has a plurality of fourth pads arranged at the second pitches on a surface. The fourth pads and the third pads are connected to each other by joining the surface of the substrate to the second surface of the interposer so as to face each other.

24 Claims, 19 Drawing Sheets

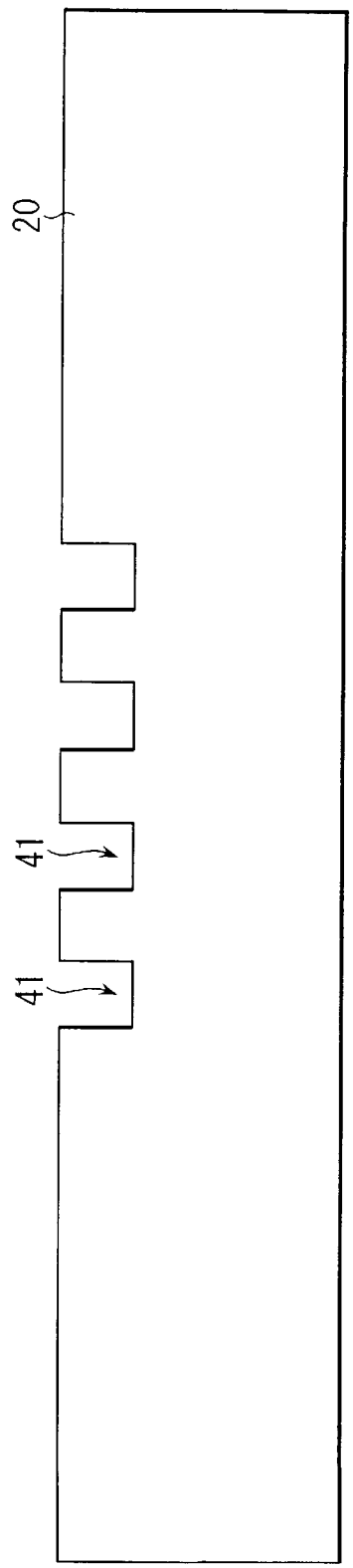
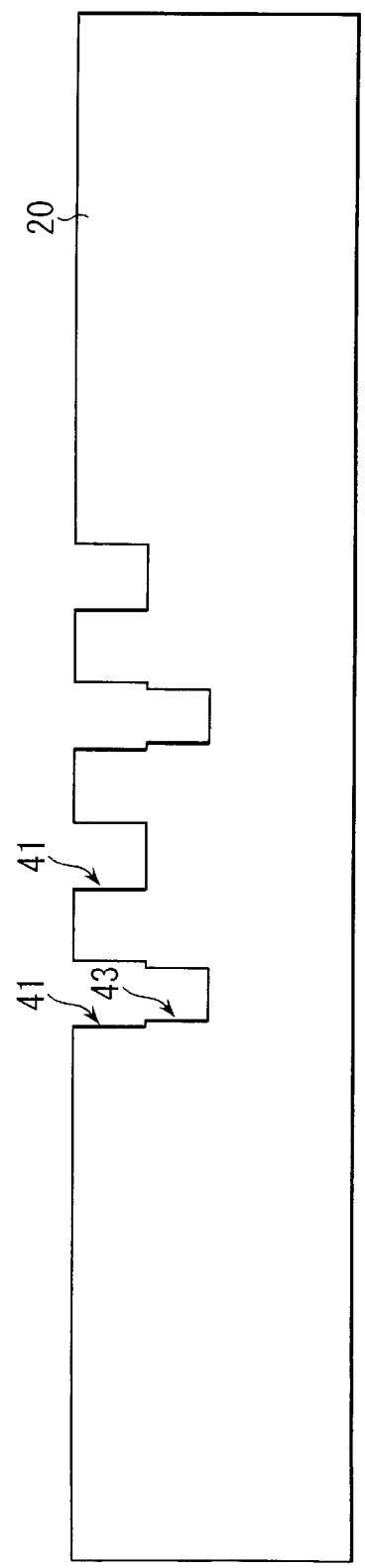
FIG. 4A
FIG. 4B

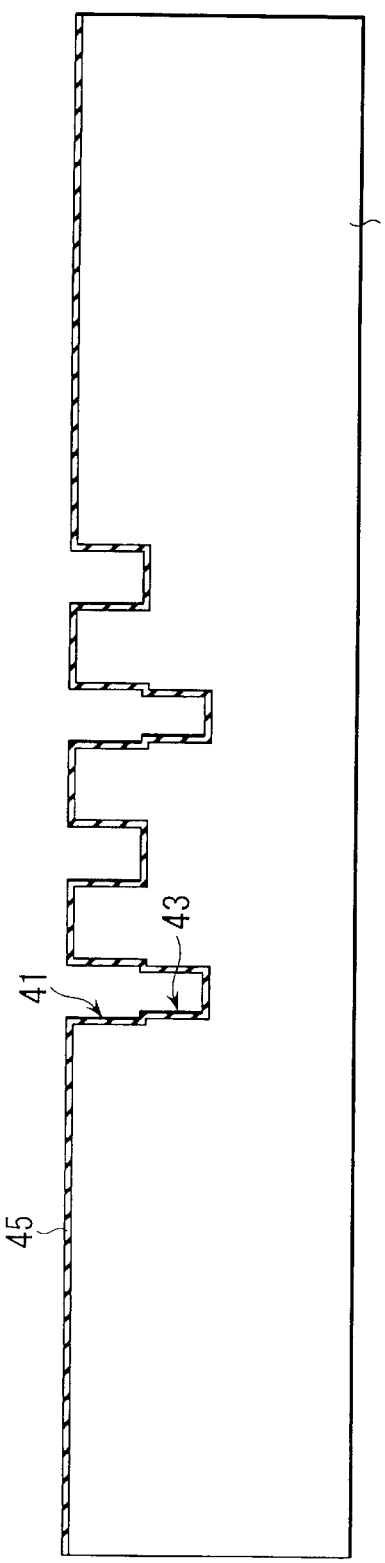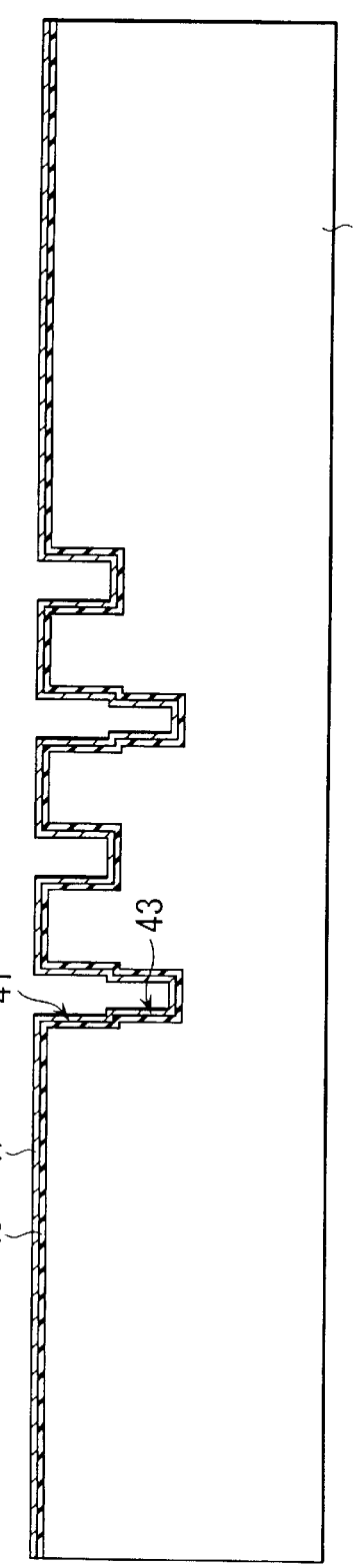
FIG. 5A
FIG. 5B

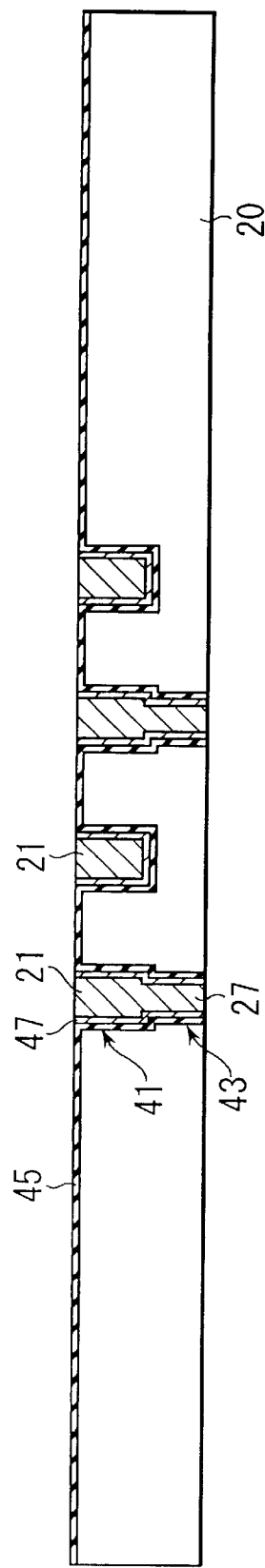
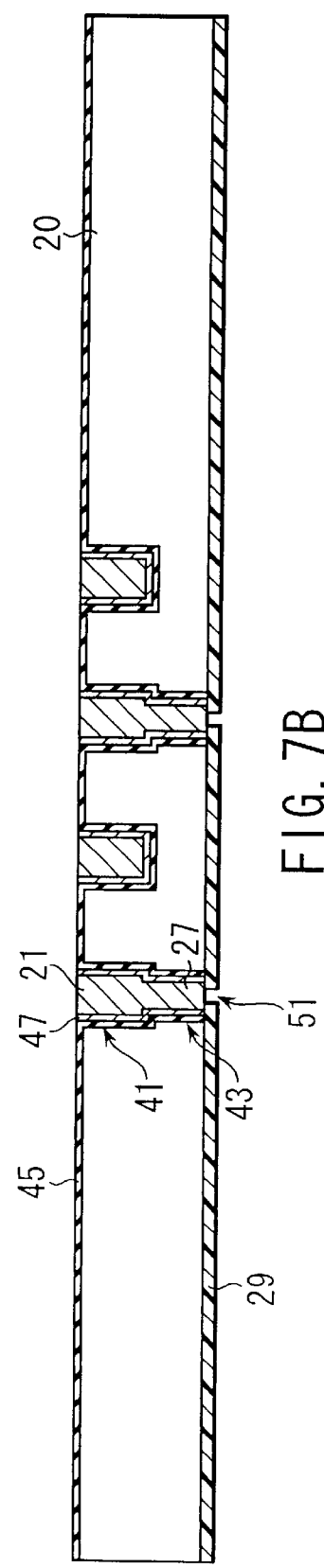
FIG. 7A
FIG. 7B

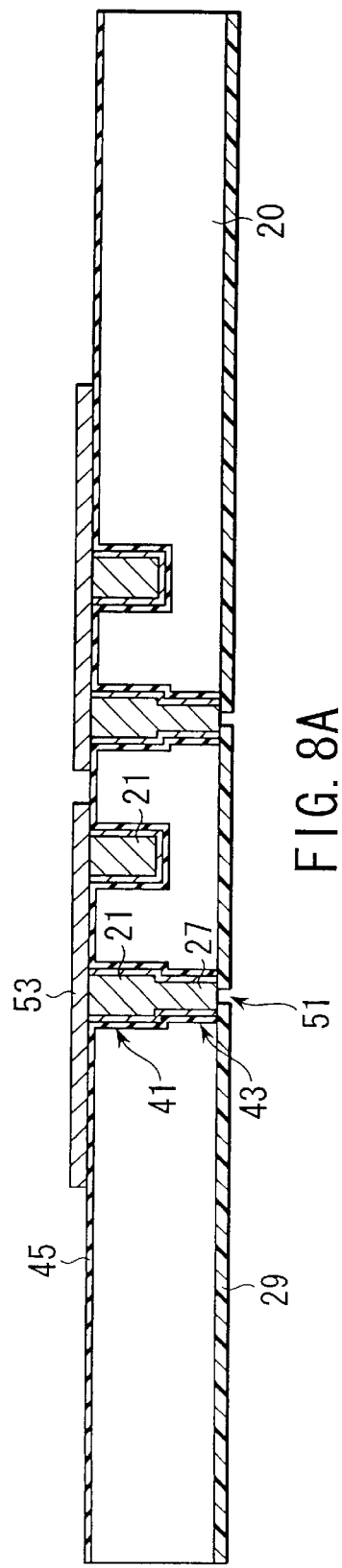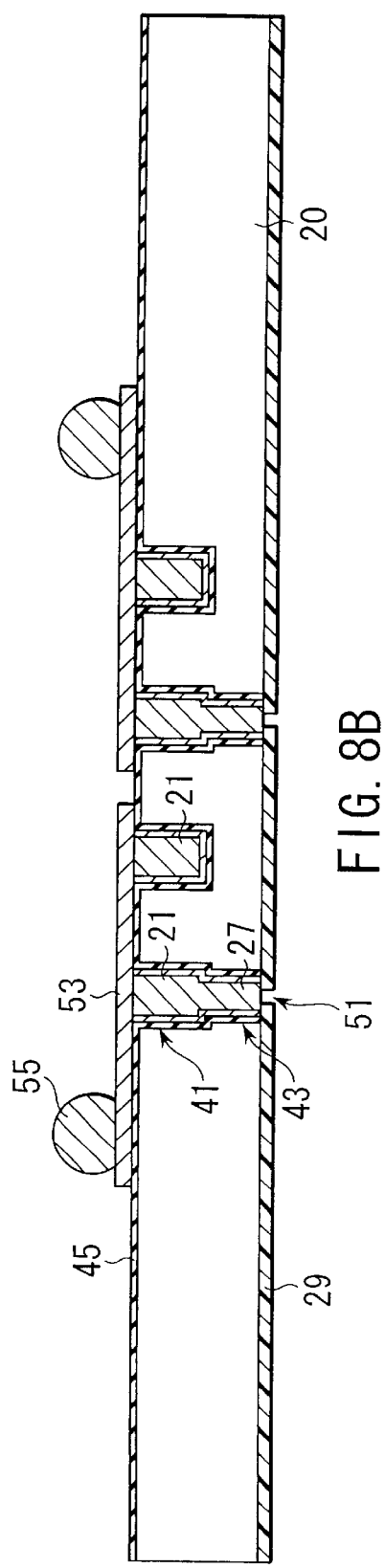
FIG. 8A
FIG. 8B

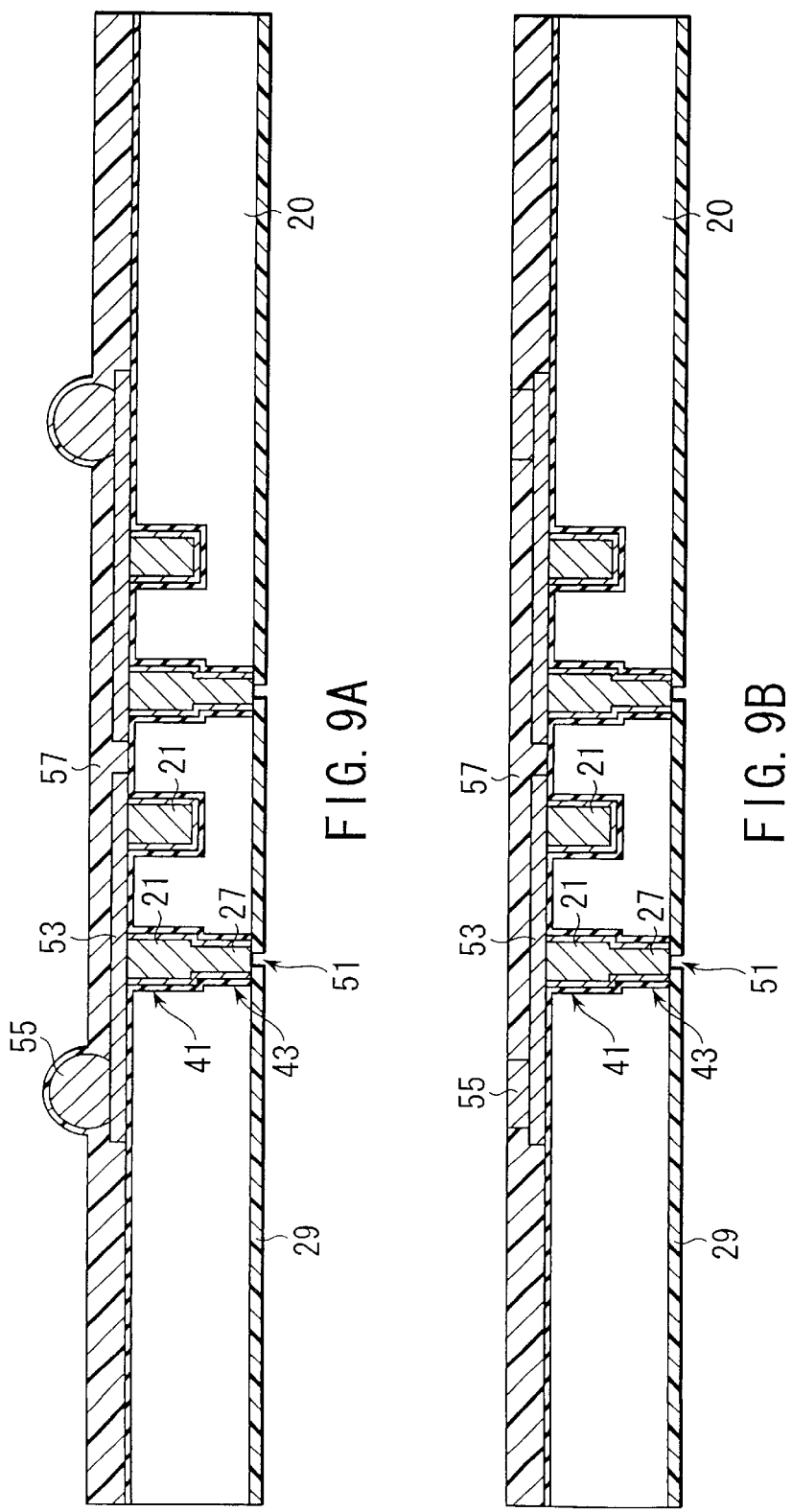

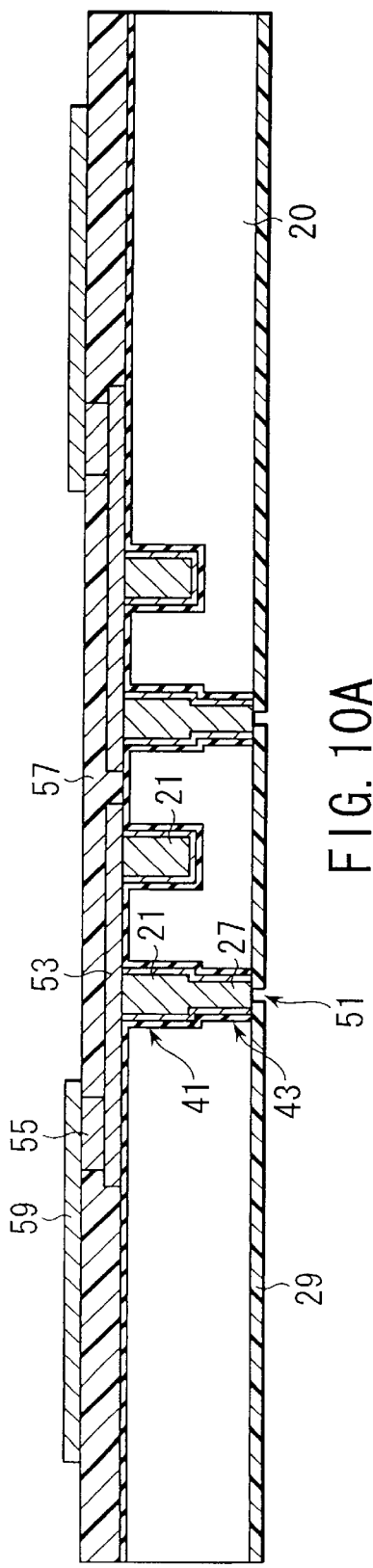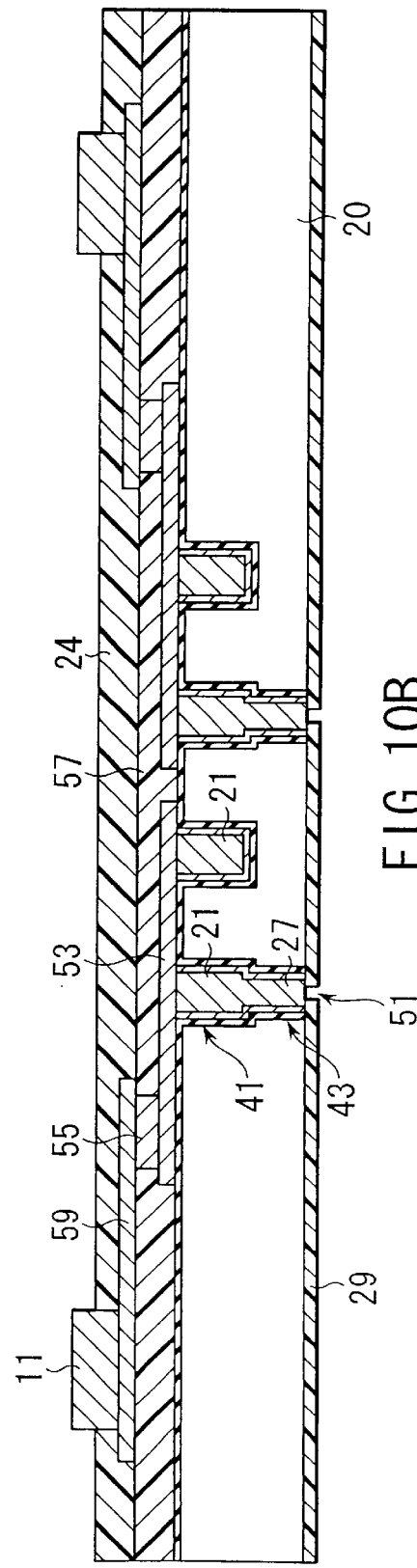
FIG. 10A
FIG. 10B

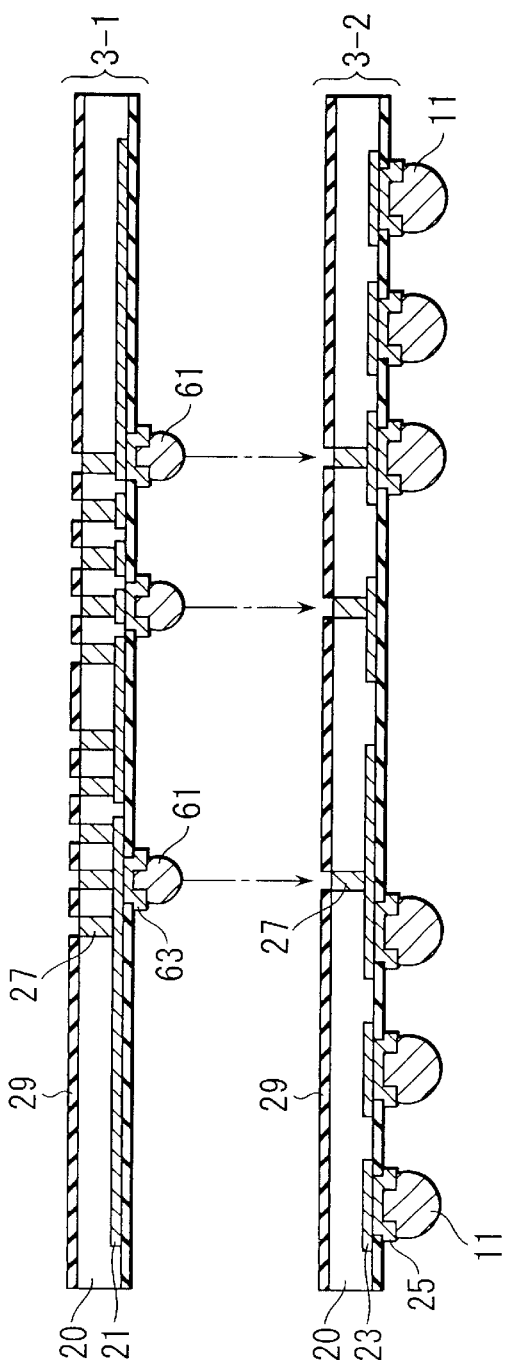
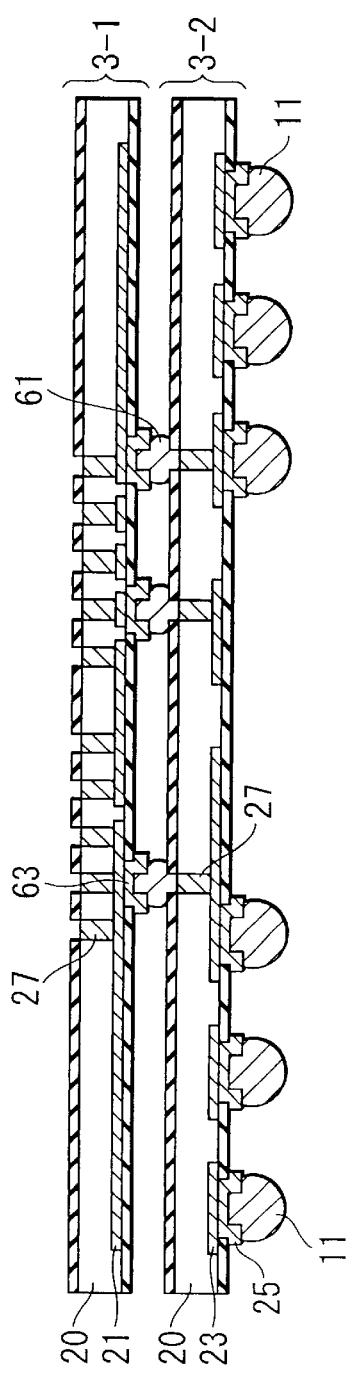
FIG. 11A
FIG. 11B

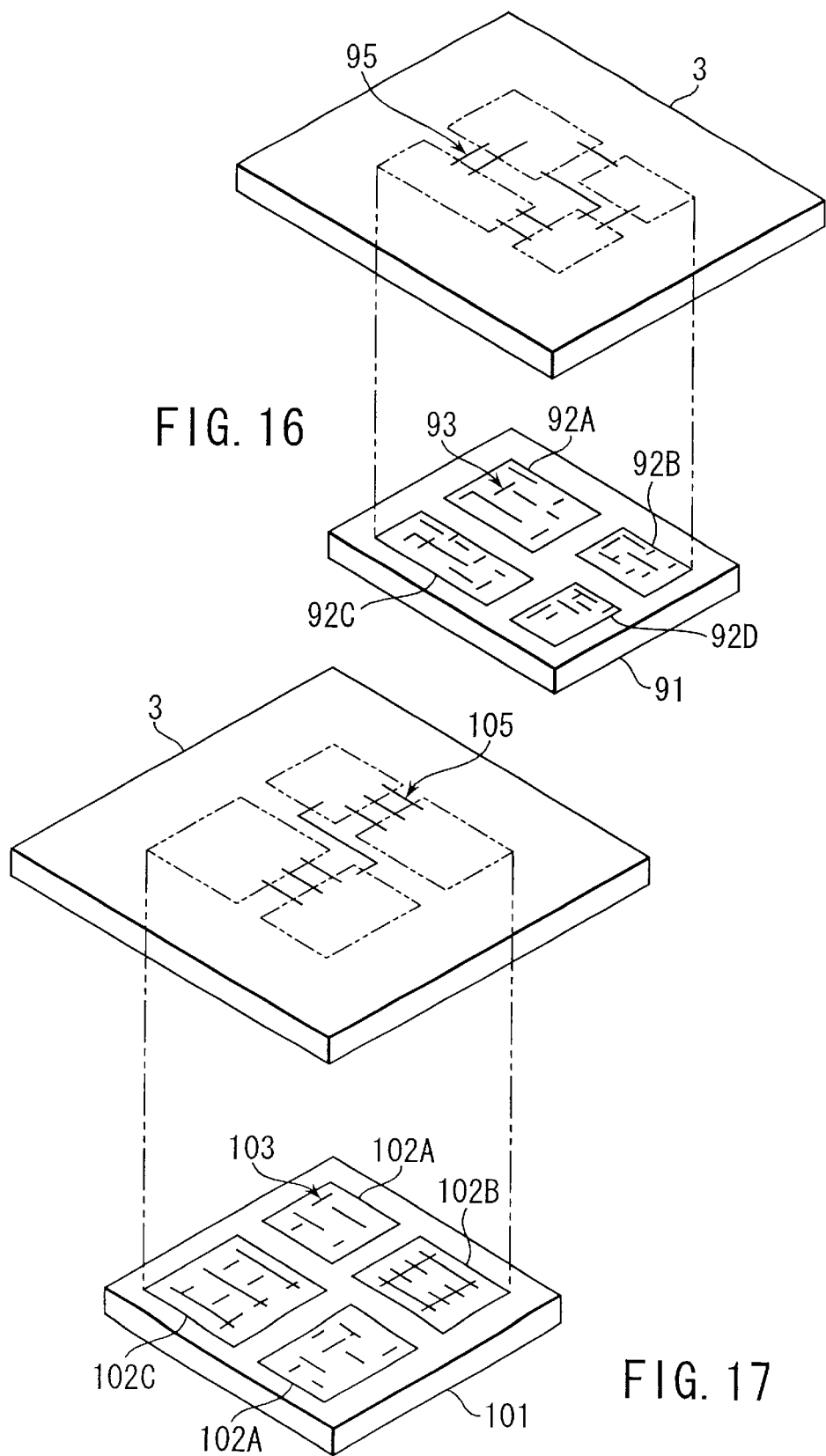

SEMICONDUCTOR INTEGRATED CIRCUIT DEVICE HAVING INTERPOSER AND METHOD OF MANUFACTURING THE SAME

CROSS-REFERENCE TO RELATED APPLICATIONS

This application is based upon and claims the benefit of priority from the prior Japanese Patent Application No. 11-273215, filed Sep. 27, 1999, the entire contents of which are incorporated herein by reference.

BACKGROUND OF THE INVENTION

The present invention relates to a semiconductor integrated circuit device having an interposer and a method of manufacturing the same.

As a semiconductor integrated circuit chip (hereinafter, referred to as "LSI chip") is reduced in size and integrated more and more, the number of pads formed of the uppermost wiring layer has been increased. Furthermore, with the increase in number, it has been accelerated that the pads are arranged at fine (narrow) intervals (hereinafter, called "pitches").

With this tendency of fine arrangement of the pads on the LSI chip, it is required for the wiring layers to be arranged at fine pitches on a package substrate, on which the LSI chip is to be mounted. However, if the wiring layers are arranged at fine pitches on the package substrate, the manufacturing cost of the package substrate increases. Therefore, even though the manufacturing cost per LSI chip is reduced by virtue of the miniaturization of the LSI chip, the manufacturing cost of the package substrate increases, increasing the total manufacturing cost of an LSI product formed of the LSI chip and the package substrate.

In the circumstances, an attempt has been made to place a member in the space between the LSI chip and the package substrate, for rearranging the pads which are arranged at fine pitches, to rough (wider) pitches, while the wiring layers are arranged at the rough pitches on the package substrate. The member is called an interposer which is responsible for rearranging the pads arranged at fine pitches on the LSI chip, at wider pitches. If the interposer is placed between the LSI chip and the package substrate, the cost of the package substrate can be maintained at the same level as that of a conventional one. Therefore, the manufacturing cost of the LSI product, which is formed of the LSI chip, interposer and package substrate, can be reduced.

On the other hand, as the width of the wiring layer within the LSI chip is reduced, the performance of the wiring layer decreases, with the result that the RC delay significantly occurs. In addition, with the miniaturization of the wiring layer itself, the deterioration in reliability of the LSI product is significantly observed. In future, as a wiring material, copper is going to be used in place of aluminum. As the interlayer insulating film, a material having a low dielectric constant is going to be inevitably employed.

However, as the wiring material changes and a material having a low dielectric constant is going to be used as the interlayer insulating film, new equipment has to be introduced, raising the manufacturing cost.

Furthermore, the number of wiring layers within the LSI chip has increased year after year, and thereby, the wiring formation steps increase. If the number of the wiring formation steps increases, not only the yield but also the throughput decreases, lowering the productivity in a plant.

In these circumstances, the manufacturing cost of the LSI chip itself has been rapidly increasing.

BRIEF SUMMARY OF THE INVENTION

The present invention is made in the aforementioned circumstances. An object of the present invention is to provide a semiconductor integrated circuit device which is formed of a semiconductor integrated circuit chip and a package substrate, the chip being mounted on the package substrate, and which is capable of suppressing an increase of a manufacturing cost, and also to provide a method of manufacturing the semiconductor integrated circuit device.

To attain the object, according to a first aspect of the present invention, there is provided a semiconductor integrated circuit device comprising:

a semiconductor chip having a plurality of first pads arranged at first pitches on a surface thereof;

an interposer having a first surface and a second surface, said first surface having a plurality of second pads arranged at the first pitches thereon and said second surface having a plurality of third pads arranged at second pitches which are larger than the first pitches; and a substrate having a plurality of fourth pads arranged at the second pitches on a surface thereof, wherein the second pads and the first pads are connected to each other by joining the first surface of the interposer to the surface of the semiconductor chip so as to face each other; and the fourth pads and the third pads are connected to each other by joining the surface of the substrate to the second surface of the interposer so as to face each other.

According to the semiconductor integrated circuit device having the aforementioned structure, the fourth pads can be arranged on the substrate at second pitches which are larger than the first pitches at which the first pads are arranged on the semiconductor chip. Therefore, it is possible to use an inexpensive substrate material and thereby prevent an increase of the manufacturing cost of the semiconductor integrated circuit device.

To attain the aforementioned object, according to a second aspect of the present invention, there is provided a semiconductor integrated circuit device having a first circuit and a second circuit, comprising:

a semiconductor chip having the first circuit formed therein;

an interposer having the second circuit formed therein, said semiconductor chip being mounted on the interposer; and a substrate on which the interposer is to be mounted.

According to the semiconductor integrated circuit device having the aforementioned structure, at least a part of the circuits formed in the semiconductor integrated circuit device is formed in the interposer. It is therefore possible to prevent an increase of the number of wiring layers of the semiconductor chip. As a result, it is possible to prevent a decrease of the yield due to the increase of the number of wiring layers. Furthermore, it is possible to prevent deterioration of the throughput due to the increase of the number of manufacturing steps. It follows that the semiconductor integrated circuit device can be prevented from increasing in manufacturing cost.

To attain the aforementioned object, according to a third aspect of the present invention, there is provided a method of manufacturing a semiconductor integrated circuit device, comprising the steps of:

forming a first substrate having a cell transistor and a plug connected to a source or a drain of the cell transistor, said plug having a site exposed outside;

forming a second substrate having a storage node electrode, a plate electrode and a ferroelectric film; said storage node electrode having a site exposed outside and said ferroelectric film being sandwiched between the plate electrode and the storage node electrode; and forming a ferroelectric RAM memory cell formed of a stacked structure of the first substrate and the second substrate by connecting the site of the plug exposed outside and the site of the storage node electrode exposed outside to each other.

To attain the aforementioned object, according to a fourth aspect of the present invention, there is provided comprising the steps of:

forming a first substrate having a cell transistor and a plug connected to a source or a drain of the cell transistor, said plug having a site exposed outside;

forming a second substrate having a storage node electrode, a plate electrode and a ferroelectric film; said storage node electrode having a site exposed outside, and said ferroelectric film being sandwiched between the plate electrode and the storage node electrode; and forming a magnetic RAM memory cell formed of a stacked structure of the first substrate and the second substrate by connecting the site of the plug exposed outside and the site of the storage node electrode exposed outside to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A, 4B, 5A, 5B, 6A, 6B, 7A, 7B, 8A, 8B, 9A, 9B, 10A and 10B are cross-sectional views individually showing major steps of a method of manufacturing an interposer 3 used in the LSI product according to the first embodiment;

FIG. 11A is a cross-sectional view showing that interposers used in the LSI product according to a second embodiment of the present invention are divided;

FIG. 11B is a cross-sectional view showing that the divided interposer pieces used in the LSI product according to a second embodiment are connected to each other;

FIG. 16 is a prospective view schematically showing an LSI product according to a fifth embodiment of the present invention;

FIG. 17 is a prospective view schematically showing an LSI product according to a sixth embodiment of the present invention;

DETAILED DESCRIPTION OF THE INVENTION

Figure 1A:
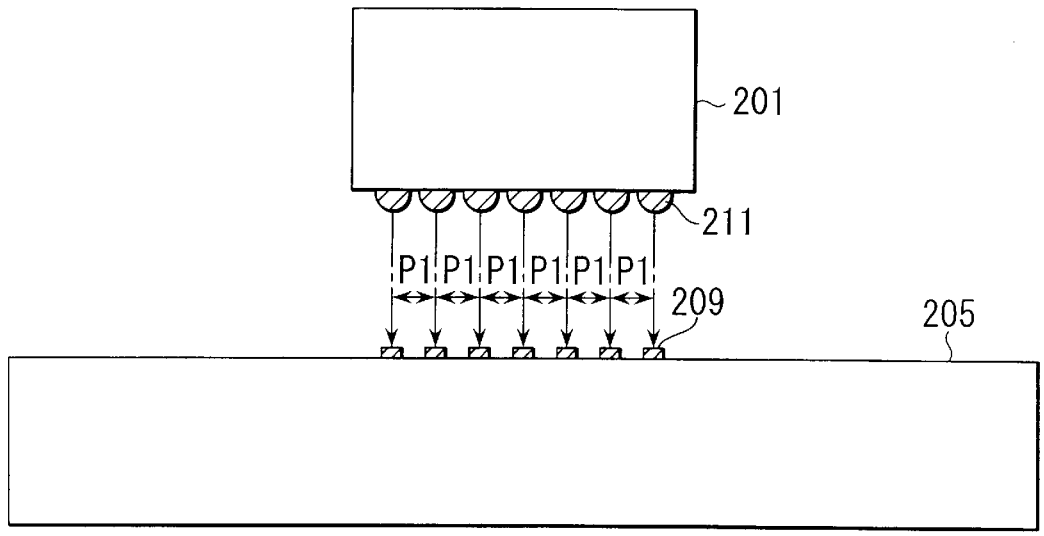
FIG. 1A is a cross-sectional view of a structure of a conventional LSI product before connected to a package substrate.

Now, embodiments of the present invention will be explained with reference to the accompanying drawings. Throughout the drawings, like reference numerals are designated to like structural elements.

First Embodiment

Figure 1B:
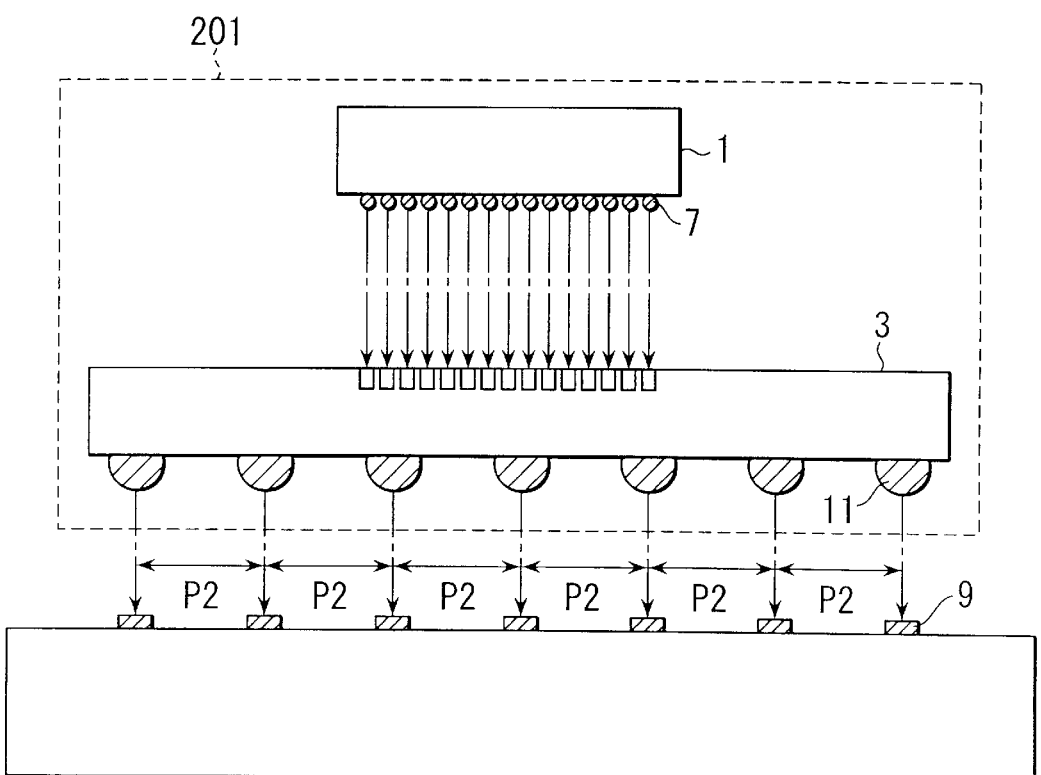
FIG. 1B is a cross-sectional view of a structure of the LSI product according to a first embodiment of the present invention before connected to a package substrate.

Referring to FIGS. 1A and 1B, the first embodiment of the present invention will be explained.

FIG. 1A is a cross-sectional view showing a structure of a conventional LSI product. FIG. 1B is a cross-sectional view showing a structure of an LSI product according to the first embodiment of the present invention.

The conventional LSI product shown in FIG. 1A is used as an comparative example of the first embodiment. The conventional LSI product has an LSI chip 201 and a package substrate 205. On the LSI chip 201, 8 wiring layers are formed. On the package substrate 205, the wiring layers 209 are arranged at fine pitches P1. The present invention attains the same function as that of the LSI chip 201 by the structure surrounded by a broken line frame 201 in FIG. 1B, that is, a structure formed of an LSI chip 1 and an interposer (also called "intermediate substrate") 3.

More specifically, in the first embodiment, the LSI chip 1 has four wiring layers and the function corresponding to the remaining four wiring layers is made by the interposer 3. To attain the corresponding function to the remaining four wiring layers, four wiring layers are formed in the interposer 3. However, many wiring layers other than four wiring layers may be formed on the interposer 3.

In the LSI chip 1, the pads which are formed of the uppermost wiring layer, are arranged at intervals (pitches) of about 10 μm to 20 μm. On each of the pads, a bump electrode 7 is formed.

The interposer 3 has the equivalent function as that of some of the wiring layers formed on the LSI chip 1. At the same time, the interposer 3 is responsible for arranging bump electrodes 11 at rough (wider) pitches P2. The bump electrode 11 used herein corresponds to the bump electrodes 211 of the LSI chip 201 in the comparative example. This constitution makes it possible to employ a package substrate 5 having wiring layers 9 arranged at rough (wide) pitches, compared to those of the package substrate 205 having the wiring layers 209 arranged at fine pitches. The package substrate 5 having the wiring layers 9 arranged at wide pitches is inexpensive compared to the package substrate 205 having the wiring layers 209 arranged at fine pitches. An example of the package substrate 5 includes a BGA(ball grid array) substrate formed of inexpensive FR-4.

Figure 2:
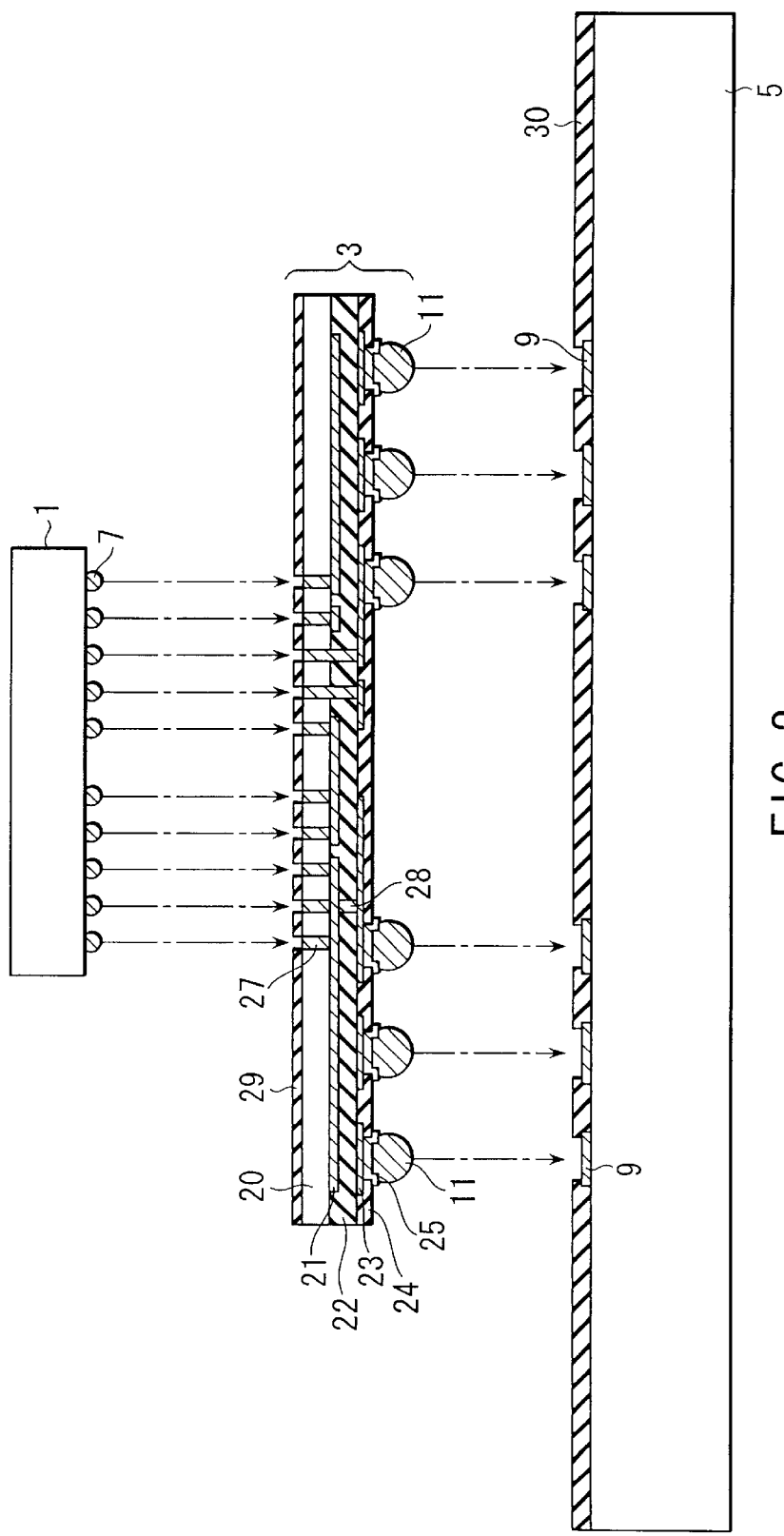
FIG. 2 is a cross-sectional view more specifically showing the LSI product (before connected to a package substrate) according to the first embodiment of the present invention.

FIG. 2 shows the details of the structure of the LSI product according to the first embodiment of the present invention. More specifically, FIG. 2 shows an interposer having dual-layered wiring.

As shown in FIG. 2, the interposer 3 is formed of a silicon substrate 20 in the same manner as in the LSI chip 1. As the silicon substrate 20, for example, a P-type silicon wafer having a resistivity of about 1 to 1000 Ωm is used. On the silicon substrate 20, a first wiring layer 21 is formed. The first wiring layer 21 is in contact with vias 27 formed in the silicon substrate 20. Each of the vias 27 is formed through the silicon substrate 20 and functions as a connection terminal to the LSI chip 1. On the silicon substrate 20, a passivation film 29 is formed. The passivation film is removed from the surface of the vias 27, so that the surfaces of the vias 27 are exposed.

On the first wiring layer 21, an interlayer insulating film 22 is formed. On the interlayer insulating film 22, a second wiring layer 23 is formed. The second wiring layer 23 is connected to the first wiring layer 21 and the via 27 through vias 28 formed in the interlayer insulating film 22 so as to attain a desired wiring function. A passivation film 24 is formed on the second wiring layer 23. In the passivation film 24, holes are formed so as to reach the second wiring layer 23. In each of the holes, a bump electrode 11 is formed via a barrier metal film 25. On the package substrate 5, wiring layers 9 and an insulating film 30 are formed. The insulating film 30 is partially removed from the upper surface regions of the wiring layers 9, so that the surface regions of the wiring layers 9 are partially exposed.

Figure 3:
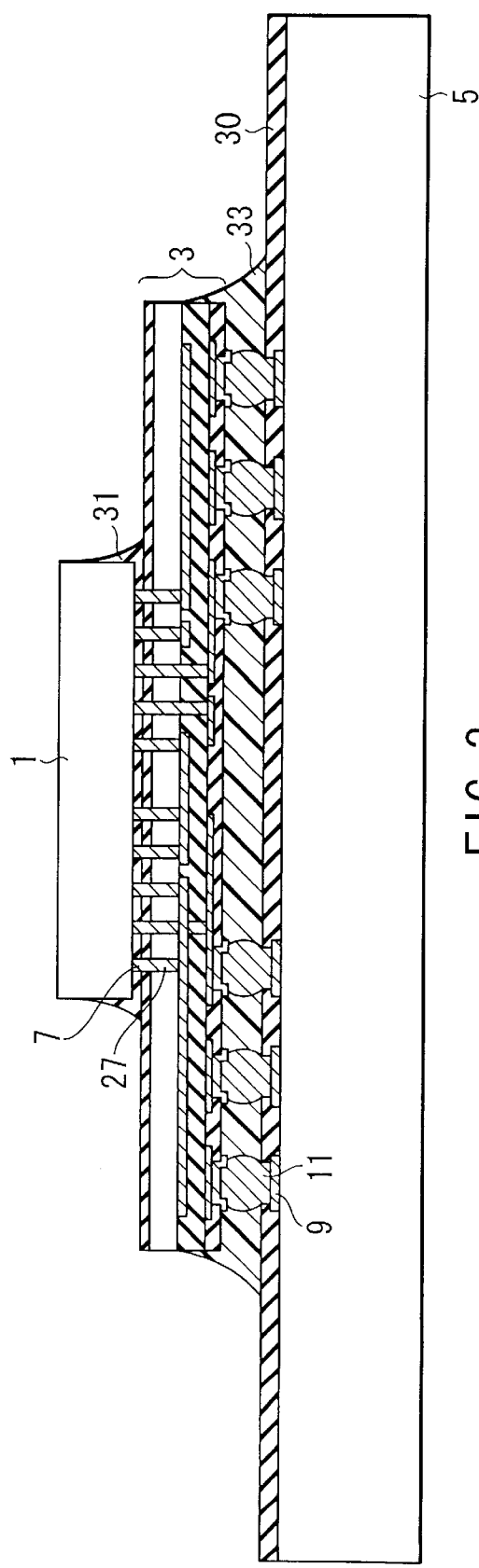
FIG. 3 is a cross-sectional view more specifically showing the LSI product (after connected to a package substrate) according to the first embodiment of the present invention.

FIG. 3 is a cross-sectional view showing that the LSI chip 1, interposer 3, and package substrate 5 are connected to each other.

As shown in FIG. 3, the bump electrodes 7 are formed on the LSI chip 1 and connected to the vias 27 of the interposer 3. Therefore, the LSI chip 1 is electrically connected to the interposer 3. The space created between the LSI chip 1 and the interposer 3 is filled with, for example a resin 31.

The bump electrodes 11 formed on the interposer 3 are connected to the wiring layers 9 of the package substrate 5, so that the interposer 3 is electrically connected to the package substrate 5. The space created between the interposer 3 and the package substrate 5 is filled with, for example, a resin 33. Note that the bump electrodes 7 are formed on LSI chip 1 herein, however they may be formed on the interposer 3.

Similarly, the bump electrodes 11 are formed on the interposer 3 herein, however they may be formed on the package substrate 5.

When the pads are arranged at pitches of about 10 μm on the LSI chip 1, a barrier metal (Ti/Ni/Pd) film is formed, by a sputtering method, on the upper surface of the LSI chip 1 having the pads formed thereon or on the back surface of the interposer 3 having the via 27 exposed therein. Subsequently, a thick resist film of about 10 μm is applied onto the barrier metal layer. Then, holes for forming bumps are formed in the thick resist film. Thereafter, an Au bump electrode is formed in each of the holes formed in the thick resist film by electroplating using the barrier metal film as a cathode. After the thick resist film is removed, the barrier metal film is removed by using the Au bump electrodes as a mask. In the manner mentioned above, the bump electrodes 7 of Au are formed with a height of about 10 μm.

The package substrate 5 and the interposer 3 have different coefficients of thermal expansion. Therefore, thermal stress is applied to the bump electrodes 11. For this reason, the bump electrodes 11 are formed of solder which is easily deformed with heat. Therefore, the thermal stress can be absorbed by the bump electrodes 11 formed of solder.

Since both the LSI chip and the interposer 3 are formed of silicon, they have the same coefficients of thermal expansion. Since no thermal stress is applied to the bump electrodes 7, both Au and solder may be used as a material for the bump electrodes 7.

Now, a manufacturing method of the interposer 3 will be explained.

Cross-sectional views of FIGS. 4A, 4B–10A, 10B respectively show major steps of the manufacturing method for interposer 3 used in an LSI product according to a first embodiment of the present invention. In the manufacturing method, an interposer having a triple-wiring layer structure is formed.

First, as shown in FIG. 4A, wiring grooves 41 are formed at intervals of 5 μm in the surface of the silicon substrate 20 by an RIE method. Each of the wiring grooves has a depth of 5 μm and a width of 5 μm. The wiring grooves 41 are formed in accordance with a pattern of the first wiring layer 21.

Subsequently, the via hole 43 is formed by etching at a desired portion of each of the wiring grooves 41, as shown in FIG. 4B.

As shown in FIG. 5A, an insulating film 45 is formed of a stacked layer of SiN/SiO$_2$ on the substrate 20 (shown in FIG. 4B) by a CVD method. The insulating film 45 serves as a film for insulating the silicon substrate 20 from the vias 27 formed later in the via holes 43.

Subsequently, as shown in FIG. 5B, a barrier metal film 47 consisting of a Ti/Ni/Pd stacked layer is formed on the insulating film 45 (shown in FIG. 5A) by a sputtering film-formation method in a high vacuum.

Figure 6A:
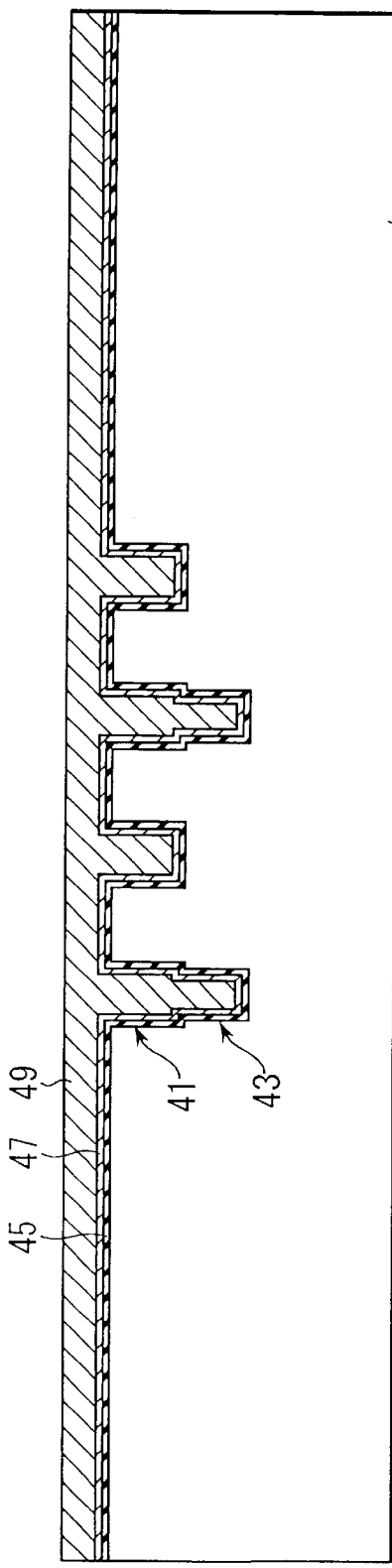

Thereafter, as shown in FIG. 6A, a Cu film 49 of 15 μm thick is formed on the barrier metal film 47 shown in FIG. 5B by electroplating using the barrier metal film 47 as a cathode.

Figure 6B:
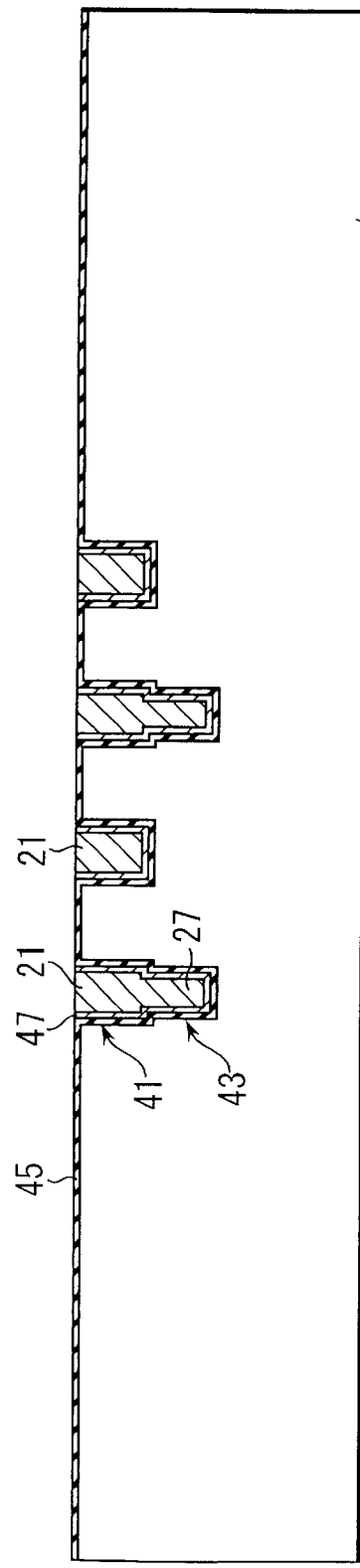

As shown in FIG. 6B, the Cu film 49 and the barrier metal 47 formed excluding the wring groove 41 are removed by a CMP method. As a result, the Cu film 49 remains in the wiring grooves 41 and the via holes 43. The Cu film 49 buried in each of the wiring grooves 41 serves as the first wiring layer 21. The Cu film 49 buried in each of the via holes 49 serves as the via 27.

As shown in FIG. 7A, the back surface of the substrate 20 is lapped until the thickness of the substrate 20 becomes 50–100 μm by a lapping method such that the bottom surface of the via 27 is exposed through the back surface of the substrate 20. In this manner, the first wiring layer 21 is formed so as to fill the via 27 from the upper surface to the back surface of the substrate 20.

Then, as shown in FIG. 7B, a passivation film 29 is formed on the back surface of the substrate 20. The material of the passivation film 29 is a photosensitive polyimide. Thereafter, the passivation film 29 made of the photosensitive polyimide is exposed to light and developed to form an exposed-via hole 51 reaching the via 27. In this way, the interposer 3 having only the first wiring layer 21 is accomplished.

The interposer 3 having a multi-layered wiring structure is formed by subsequently performing the following processes.

First, as shown in FIG. 8A, a metal paste is printed on the surface of the interposer 3 by a screen printing method. Thereafter, the metal paste is baked to form a second wiring layer 53, and then, bump electrodes 55 made of Au or Cu are formed on predetermined portions of the second wiring layer 53, as shown in FIG. 8B.

Then, as shown in FIG. 9A, an interlayer insulating film 57 is formed on the upper surface of the interposer 3 by a spin-coating method. The interlayer insulating film 57 is made of an organic insulating material such as a polyimide or SOG having a dielectric constant of as low as 4 or less. The organic insulating material having a low dielectric constant used herein is generally a material whose dielectric constant is as low as that of $SiO_2$ formed by a CVD method.

After that, as shown in FIG. 9B, the interlayer insulating film 57 is polished by a CMP method until the top edges of the bump electrodes 55 are exposed. As a result, via plugs are formed which allow multi-layered wiring layers to be contact with each other.

If the steps explained in FIGS. 8A to 9B are repeatedly applied to the surface of the interposer 3, the required number of times depending upon the function of the multi-layered wiring added to the interposer 3, it is possible to obtain a multi-layered wiring structure having any number of layers.

Alternatively, a wiring formation step generally employed in manufacturing an LSI chip may be repeated the required number of times to obtain the multilayered wiring structure.

Next, as shown in FIG. 10, a metal paste is printed on the upper surface of the interposer 3 shown in FIG. 9B by a screen printing method and then baked to obtain a third wiring layer 59.

Subsequently, as shown in FIG. 10B, when the pads of wiring are arranged on the package substrate at pitches of about 250 μm, solder bump electrodes 11 of about 100 μm height are formed by a screen printing method using a solder paste. Thereafter, if necessary, the passivation film 24 is formed.

In this manner mentioned above, the interposer 3 having a wiring function according to the first embodiment is accomplished.

In the LSI product according to the first embodiment, the LSI chip 1 formed of four wiring layers, the interposer 3 having a wiring function corresponding to four wiring layers which are formed on the LSI chip in the comparative example, and the package substrate 5 are connected respectively via the bump electrodes 7 and 11. By virtue of this structure, it is possible to reduce the number of wiring layers of the LSI chip 1. Furthermore, it is possible to improve both the yield and throughput of the LSI chip.

Accordingly, the manufacturing cost of the LSI chip 1 can be prevented from increasing.

The interposer 3 is formed by using the manufacturing process for an LSI in the same manner as in the case of the LSI chip 1. Since the interposer 3 is made larger than the LSI chip 1, it is possible to form the interposer 3 by using conventionally-used known equipment and manufacturing apparatus without using leading-edge equipment and manufacturing apparatus. Therefore, the method has an advantage in that the conventionally used known equipment/manufacturing apparatus can be efficiently used. If the conventionally used known equipment/manufacturing apparatus is used, it is desired that the conventional manufacturing line is improved in availability ratio, that is, in productivity in a plant.

In respect of these points, the manufacturing cost of the LSI product according to the first embodiment is prevented from increasing. As a result, an LSI product can be obtained at a low cost.

The quality of the interposer 3 can be checked in the stage of a module in which the interposer 3 is connected to the LSI chip 1, before connected to the package substrate 5. When an electrically defective portion is found in this stage, if it is specified which part of the LSI chip or the interposer 3 is responsible for the defect, the defective part is replaced with a new part by separating the LSI chip 1 and the interposer 3 from each other.

The repair of parts can be performed after the LSI chip 1, interposer 3 and package substrate 5 are connected to each other.

Second Embodiment

In the first embodiment, a single interposer 3 is used. However, the interposer 3 may be divided into several layers in accordance with the number of wiring layers and joined into one by stacking one upon another.

FIGS. 11A and 11B show cross-sectional views of an interposer used in the LSI product according to the second embodiment of the present invention. In FIG. 11A, the interposer is divided into layers. In FIG. 11B, the divided layers of the interposer are joined into one.

As shown in FIG. 11A, in a first interposer layer 3-1, the first wiring layer 21 (shown in FIG. 2) is formed. Furthermore, in the second interposer layer 3-2, the second wiring layer 23 (shown in FIG. 2) is formed.

On the first wiring layer 21 of the interposer 3-1, bump electrodes 61 are formed via a barrier metal film 63. Each of the bump electrodes 61 serves as a connecting member for connecting the first wiring layer 21 to the via 27 of the interposer 3-2. FIG. 11B shows that the interposer 3-1 is allowed to be in contact with the interposer 3-2. As shown in FIG. 11B, the bump electrode 61 is connected to the via 27 exposed through the back surface of the interposer 3-2. As described in the above, the interposers 3-1 and 3-2, which are divided in accordance with the number of wiring layers, may be stacked on top of each other.

According to the second embodiment, it is possible to reduce the number of wiring layers within the interposer 3-1 or 3-2. Usually when the number of wiring layers within the interposer 3 increases, the yield is expected to be reduced. However, in this embodiment, the number of wiring layers within the interposer 3-1 or 3-2 is reduced. Therefore, it is possible to reduce the manufacturing cost of the interposer.

In the second embodiment, two interposer layers stacked on top of each other are used. However, a stacked structure of three interposer layers or more may be used. The space created between the interposer 3-1 and the interposer 3-2 may be filled with a resin.

A Third Embodiment

The bump electrodes is used to connect the LSI chip 1 and the interposer 3 in the first and second embodiments. However, the connection may be made by a different connecting means other than the bump electrodes. In the third embodiment, another connecting means except the bump electrodes is used for connecting the LSI chip to the interposer.

Figure 12:
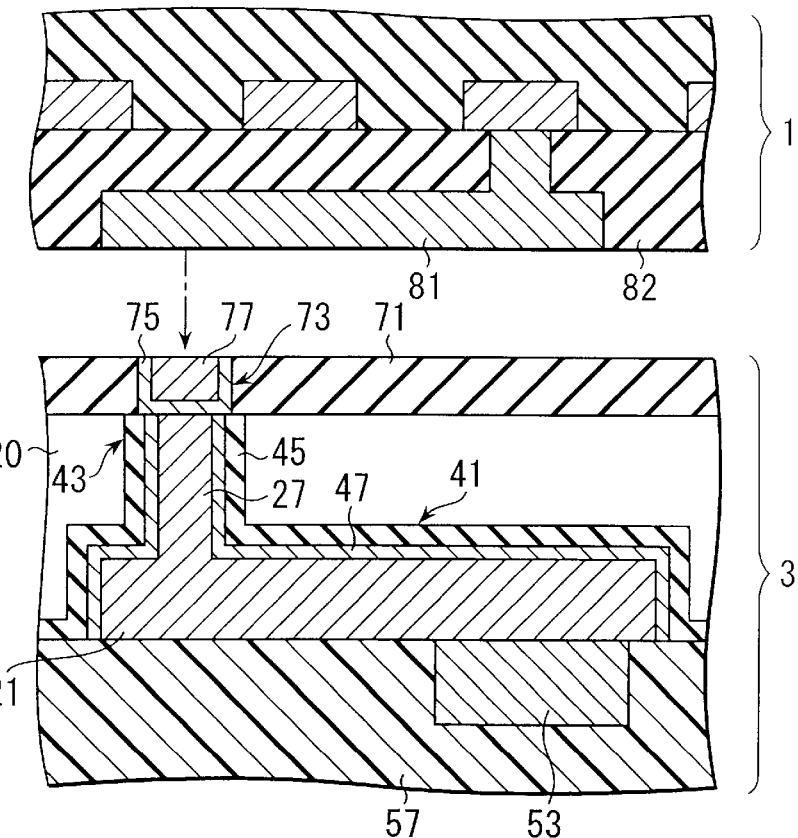
FIG. 12 is a cross-sectional view showing connecting portions (before connected) of the LSI chip and the interposer in the LSI product according to the third embodiment of the present invention.

FIG. 12 shows a cross-sectional view of the connecting portion between the LSI chip and the interposer in the LSI product according to the third embodiment of the present invention.

As shown in FIG. 12, a passivation film 71 is formed on the silicon substrate 20 of the interposer 3. On the passivation film 71, a via hole 73 is formed in which the via 27 is exposed. In the via hole 73, a barrier metal film 75 and a via 77 consisting of a conducting material are formed. The via 77 is electrically connected to the via 27. In this embodiment, the surfaces of the passivation film 71 and the via 77, in other words, the back surface of the interposer 3 is flattened by lapping or CMP.

Figure 13:
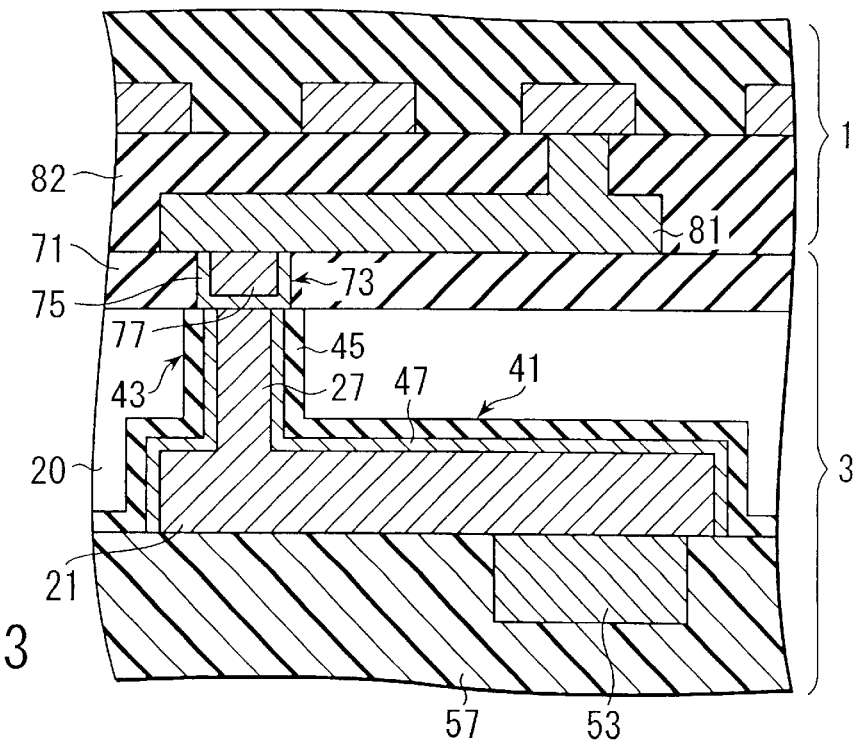
FIG. 13 is a cross-sectional view showing the connecting portion (after connected) between the LSI chip and the interposer in the LSI product according to the third embodiment of the present invention.

In the uppermost interlayer insulating film 82, of the LSI chip 1, a wiring groove is formed. In the wiring groove, the uppermost wiring layer 81 is formed. In the embodiment, the surfaces of the interlayer insulating film 82 and the wring layer 81, in other words, the upper surface of the LSI chip 1 is flattened by lapping or CMP. The flattened upper surface of the LSI chip 1 is joined to the flattened back surface of the interposer 3. FIG. 13 shows that these elements are joined to each other. As shown in FIG. 13, the upper surface of the LSI chip 1 is joined to the back surface of the interposer 3 such that the wiring layer 81 is in contact with the via 77.

Furthermore, the upper surface of the LSI chip 1 and the back surface of the interposer 3 are flattened.

Therefore, the LSI chip 1 and the interposer 3 are bonded to each other based upon the principal of mirror-surface bonding. Therefore, the LSI chip 1 can be connected to the interposer 3 without the bump electrode interposed between them.

The interlayer insulating films 71, 82 are formed of an organic insulating material having a low dielectric constant such as polyimide which has a lower dielectric constant than $SiO_2$ (CVD- $SiO_2$) or CVD—$SiO_2$ formed by a CVD method. On the other hand, the materials of the via 77 and the wiring layer 81 are metals such as Cu and Al.

Fourth Embodiment

The fourth embodiment is another example in which LSI chip is connected to the interposer with a connecting means other than the bump electrodes, in the same as in the third embodiment.

Figure 14:
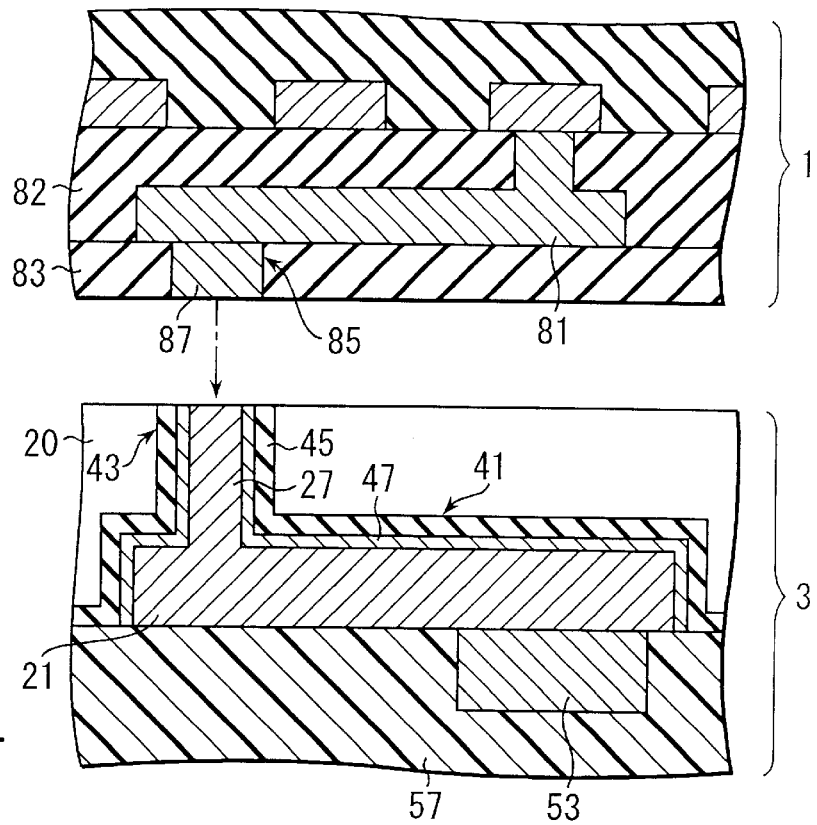
FIG. 14 is a cross-sectional view showing a connecting portions (before connected) of the LSI chip and the interposer in the LSI product according to the fourth embodiment of the present invention.

FIG. 14 is a cross-sectional view showing a connecting portion between the LSI chip and the interposer in the LSI product according to the fourth embodiment of the present invention.

As shown in FIG. 14, an insulating film 83 is formed on the wiring layer 81 of the LSI chip 1 and the interlayer insulating film 82. In the insulating film 83, a via hole 85 is formed in which the wiring layer 81 is exposed. In the via hole 85, a via 87 is formed. The via 87 is electrically connected to the wiring layer 81. In this embodiment, the surfaces of the insulating film 83 and the via 87, in other words, the supper surface of the LSI chip 1 is flattened by lapping or CMP.

Figure 15:
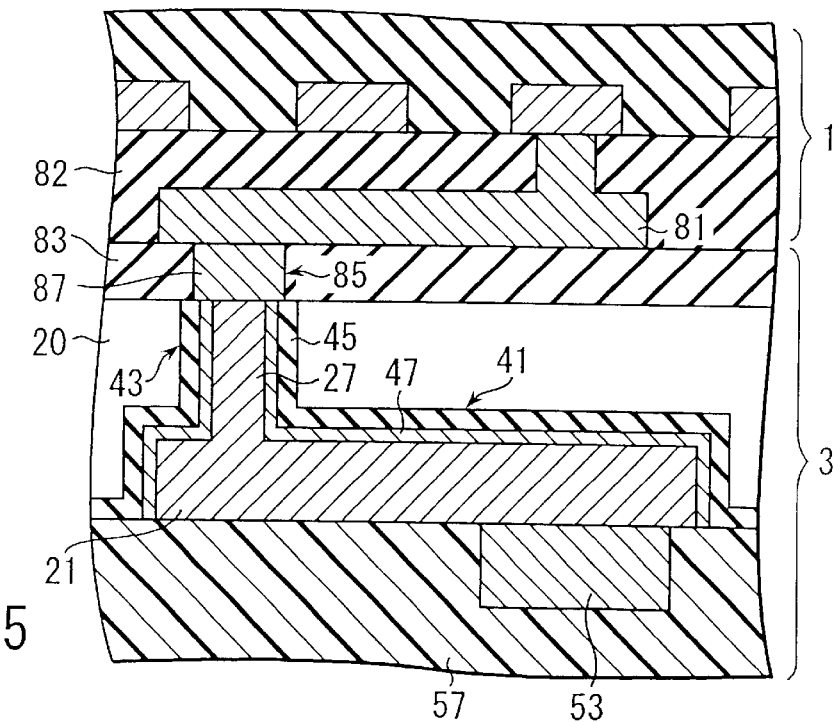
FIG. 15 is a cross-sectional view showing a connecting portion (after connected) between the LSI chip and the interposer in the LSI product according to the fourth embodiment of the present invention.

In the back surface of the interposer 3, the silicon substrate 20 and the via 27 appear. The back surface is flattened by lapping or CMP. The flattened upper surface of the LSI chip 1 is joined to the flattened back surface of the interposer 3. FIG. 15 shows that these elements are joined to each other. As shown in FIG. 15, the upper surface of the LSI chip 1 is joined to the back surface of the interposer 3 such that the via 87 is in contact with the via 27.

Furthermore, the upper surface of the LSI chip 1 and the back surface of the interposer 3 are flatted in the same manner as in the third embodiment. Therefore, the LSI chip 1 and the interposer 3 are bonded based upon the principle of mirror surface bonding.

The insulating film 83 is formed of an organic insulating material having a low dielectric constant such as polyimide which has a lower dielectric constant than $SiO_2$(CVD—$SiO_2$) or CVD- $SiO_2$. On the other hand, the materials of the via 27 and the wiring layer 87 are metals such as Cu and Al. Note that the connecting methods explained in the third and fourth embodiments may be applied to connecting the interposers explained in the second embodiment.

Fifth Embodiment

FIG. 16 is a perspective view schematically showing an LSI product according to the fifth embodiment of the present invention.

In FIG. 16, an ASIC product is shown which has an ASIC chip 91 and the interposer 3. The ASIC product is formed by connecting a plurality of cell blocks so as to attain a desired function.

The wiring formed in the ASIC product, is roughly divided into two types. One is an inner-block wiring 93 which is formed within a cell block. The other is an inter-block wiring 95 which connects cell blocks to each other. These wirings 93 and 95 are stacked in a multiple layer to form a multiple wiring layer. In future, the usage of the ASIC product is considered to be diversified. With this tendency, the numbers of wiring layers 93, 95 is predicted to increase.

In the ASIC chip 91 shown in FIG. 16, four cell blocks 92A to 92D are formed. The inner-block wiring 93 is formed in each of the cell blocks 92A–92D in the ASIC chip 91. The inter-block wiring 95 is formed in the interposer 3. The multi wiring layers constituting the inter-block wiring 95 may be formed in entirety or in part within the interposer 3.

According to the fifth embodiment thus mentioned, it is possible to reduce the number of wiring layers formed within the ASIC chip 91. Usually when the number of wiring layers within the ASIC chip 91 increases, the yield is expected to be reduced with the result that the manufacturing cost may increase. However, in this embodiment, the number of wiring layers within the ASIC chip 91 is reduced. Therefore, it is possible to reduce the manufacturing cost. It is considered that this embodiment is useful in reducing manufacturing cost of the ASIC product in which the number of wiring layers presumably increases.

Sixth Embodiment

FIG. 17 is a perspective view schematically showing an LSI product according to the sixth embodiment of the present invention.

More specifically, FIG. 17 shows a system LSI product having a system LSI chip 101 and an interposer 3. In the system LSI chip 101, a logic, DRAM, and ferroelectric random access memory (ferroelectric RAM), are integrally formed in a single chip although they are formed in separate chips.

In the same as in the ASIC product, the wiring of the system LSI product is roughly divided into an inner-block wiring 103 and the inter-block wiring 105. Each of the wirings 103 and 105 has a multi-layered structure as the same as in the ASIC product. The number of stacked wiring layers varies depending upon the scale of the system integrated into a single chip and is predicted to several tens of layers in future.

In the LSI chip 101 shown in FIG. 17, two logics 102A, a single DRAM 102B, and a single ferroelectric RAM 102C are formed. The inner-block wiring 103 is formed in each of the logics 102A, DRAM 102B and ferroelectric RAM 102C within the system LSI chip 101. The inter-block wiring 105 is formed within the interposer 3. The wiring layers of the multi-layered wiring which forms the inter-block wiring 105 may be formed in entirety or in part in the interposer 3, in the same manner as in the fifth embodiment.

According to the sixth embodiment, the number of wiring layers within the system LSI chip 101 can be reduced.

Usually when the number of wiring layers within the system LSI 101 increases, the yield is expected to be reduced, with the result that the manufacturing cost may increase. However, in this embodiment, the number of wiring layers within the system LSI 101 is reduced. It is considered that this embodiment is useful in reducing manufacturing cost of the system LSI product in which several tens of wiring layers presumably are stacked.

Seventh Embodiment

The interposer 3 used in the LSI product of the present invention is formed by using a silicon substrate (silicon wafer). Therefore, it is possible to form not only the wiring but also a circuit element constituting an integrated circuit in the interposer 3. Examples of the circuit element include active elements such as a transistor and passive elements such as a resistance, capacitor, and inductor.

Now, an LSI product having the interposer 3 having a circuit element formed therein will be explained as a seventh embodiment of the present invention.

Figure 18A:
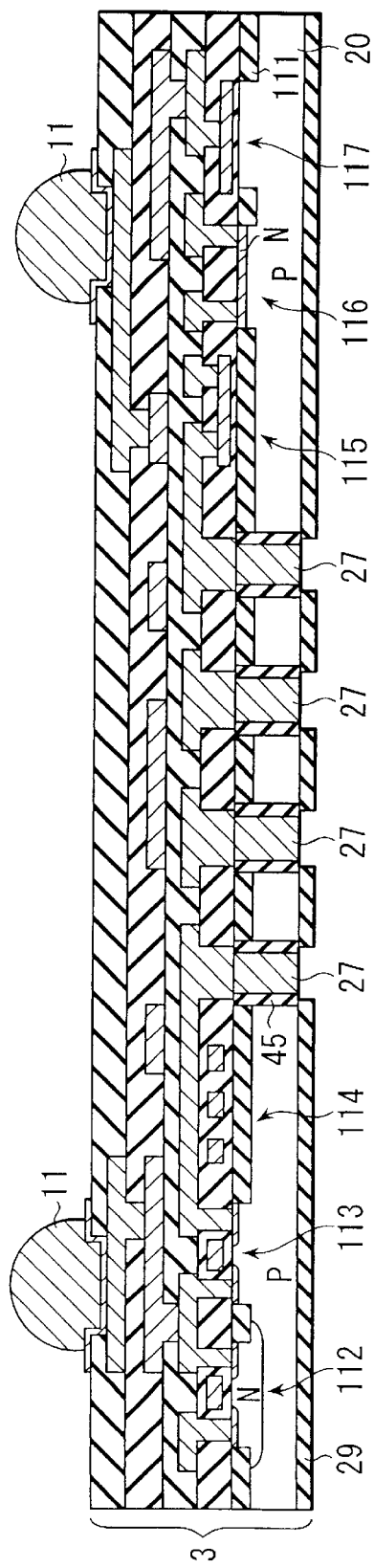
FIG. 18A is a cross-sectional view of an interposer having circuit elements used in an LSI product according to a seventh embodiment.

FIG. 18A is a cross-sectional view of an interposer having a circuit element used in the LSI product according to seventh embodiment of the present invention.

As shown in FIG. 18A, an element isolation region 111 is formed on a silicon substrate 20 to isolate the element region. The element isolation region 111 is formed by, for example, shallow trench isolation. An active element and a passive element serving as circuit elements are formed on the element region isolated by the element isolation region 111 or on the element isolation region 111.

In FIG. 18A, N-channel type MOSFET (NMOS) 113 and P-channel type MOSFET (PMOS) 112 are shown as examples of the active elements. The NMOS 113 is formed within the substrate 20 when the silicon substrate 20 is formed of a P-type. The PMOS 112 is formed in an N type region (well) formed in the substrate 20 when the silicon substrate 20 is formed of P-type.

Furthermore, in FIG. 18A, an inductor, resistance and capacitor are shown as examples of passive elements. As an example of the inductor, there is a planer type inductor 114 having a spiral-form wiring layer formed on, for example, the element isolation region 111. As examples of the resistance, there are a polysilicon resistor 115 formed on the element isolation region 111 and an N-type diffusion layer resistance 116 formed in the silicon substrate 20. As an example of a capacitor, there is an MOS capacitor 117. A desired integrated circuit is formed in the interposer 3 by connecting these active elements and passive elements.

Figure 18B:
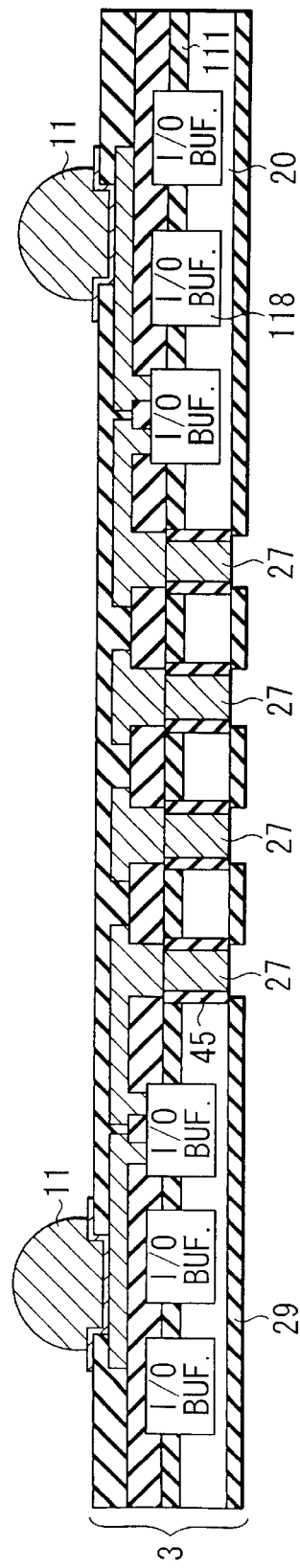
FIG. 18B is a cross-sectional view of an interposer having an integrated circuit formed of the circuit elements shown in FIG. 18A.

FIG. 18B is a cross-sectional view of the interposer having an integrated circuit formed of circuit elements shown in FIG. 18A. As shown in FIG. 18B, the integrated circuit formed in the interposer 3, an input/output circuit (I/O BUF) 118 of the LSI chip is preferable as the integrated circuit formed in the interposer 3.

If the input/output circuit 118 is formed in the interposer 3 as described, it is possible to prevent an increase of the chip area in the LSI chip. In addition to this advantage, there is another advantage. This is that the driving capacity of an input/output circuit can be increased. More specifically, the size of the interposer 3 can be increased than the LSI chip. In addition, miniaturization processing of the interposer 3 is not required compared to the LSI chip. As a result, it is possible to increase the size of a transistor constituting the input/output circuit. If the transistor is increased in size, that is, a channel width of the transistor is made longer, it is possible to increase a driving capacity of the input/output circuit. Enlargement of the driving capacity of the input/output circuit favorably contributes to a high-speed operation in the electric appliance system formed of the LSI product.

According to the seventh embodiment, it is preferable that the integrated circuit such as an input/output circuit of the LSI chip, is formed in the interposer 3. This is because the area of the LSI chip can be prevented from increasing. In addition, the driving capacity of the input/output circuit can be enlarged.

Eighth Embodiment

In the seventh embodiment, we explained that an integrated circuit can be formed in the interposer 3. Furthermore, we explained specific and preferable examples of the integrated circuit formed in the interposer 3. In the eighth embodiment, another specific and preferable example of the integrated circuit formed in the interposer 3 will be explained.

As explained with reference to FIG. 17, a system LSI technology for integrating the functions of a logic and a memory into a single chip is being advanced at present.

The LSI chip formed by integrating the functions of a logic and a memory into a single chip is called "system LSI chip". However, the system LSI chip has a problem in a high manufacturing cost. This is because the number of manufacturing steps is increased since integrated circuits formed in different processes are integrally formed in a single chip. This is also because the yield decreases due to the increase of the number of manufacturing steps.

More specifically, in the system LSI chip 101, logics 102A, DRAM 102B and ferroelectric RAM 102C are integrally formed as shown in FIG. 17. In the integrated circuit, the process of the ferroelectric RAM 102C differs from those of the logic 102A and DRAM 102B. To form the ferroelectric RAM 102C called a ferroelectric memory, a process for forming a specific structure called a ferroelectric capacitor is required. Therefore, the number of manufacturing steps of the system LSI chip increases by steps for forming the ferroelectric capacitor.

Figure 19:
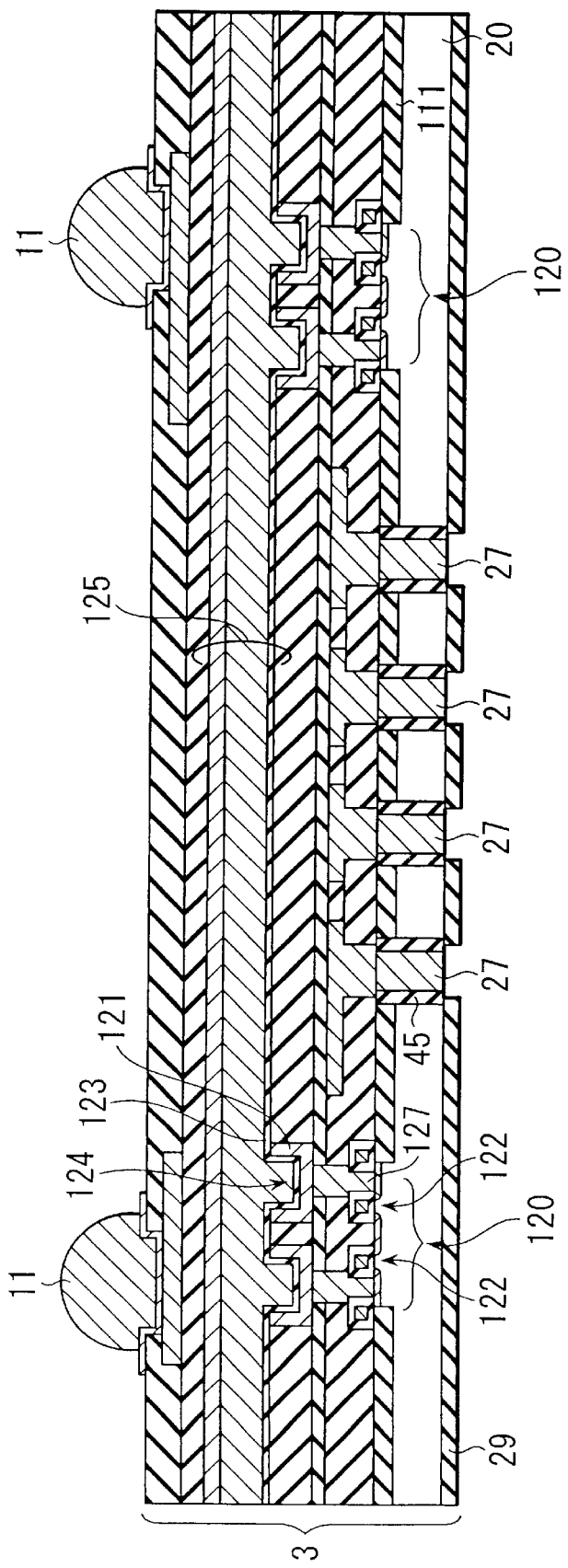
FIG. 19 is a cross-sectional view of an interposer having a ferroelectric RAM and used in an LSI product according to an eighth embodiment of the present invention.

Then, in the eighth embodiment, the ferroelectric RAM is formed in the interposer 3. FIG. 19 shows a cross-sectional view of the interposer 3 in which the ferroelectric RAM is formed. Of various circuits constituting the ferroelectric RAM, the circuit of a memory cell is particularly shown in FIG. 19.

As shown in FIG. 19, a ferroelectric RAM memory cell 120 is constituted of a cell transistor 122 and a ferroelectric capacitor 124 connected to a source or drain of the cell transistor 122. The ferroelectric capacitor 124 is constituted of a storage node electrode 121, a ferroelectric film 123 and a plate electrode 125. The ferroelectric film 123 is formed on the storage node electrode 121. The plate electrode 125 is formed on the ferroelectric film 123. FIG. 19 shows a stacked type ferroelectric RAM memory cell 120 in which the ferroelectric capacitor 124 is arranged above the cell transistors 122. The storage node electrode 121 is connected to the source or drain of the cell transistor 122 via a plug 127.

As described, the ferroelectric RAM is formed in the interposer 3 in this embodiment. Therefore, the number of steps of manufacturing the system LSI chip can be reduced and thereby the yield is improved.

Furthermore, the interposer 3 having the ferroelectric RAM formed therein is connected to the system LSI chip. It is therefore possible to obtain the LSI product having the same function as the LSI chip in which the ferroelectric RAM is formed, without raising the manufacturing cost.

Ninth Embodiment

As the ferroelectric film or a film usable as the ferroelectric film, a BSTO (in general,(Ba, Sr)TiO$_3$)film is known. However, the film of this type is poor in resistance during the step of hydrogen annealing (also called "sinter") performed to obtain good transistor characteristics in the manufacturing process of the LSI chip. In other words, the quality of the BSTO film is likely to deteriorate by hydrogen annealing.

In the ninth embodiment, the interposer in which the BSTO film is to be formed is separated from an LSI chip in which a transistor is to be formed, or another interposer in which a transistor is to be formed. In the ninth embodiment, the interposer in which the ferroelectric RAM is to be formed will be explained as an example of the interposer having the BSTO film.

Figure 20:
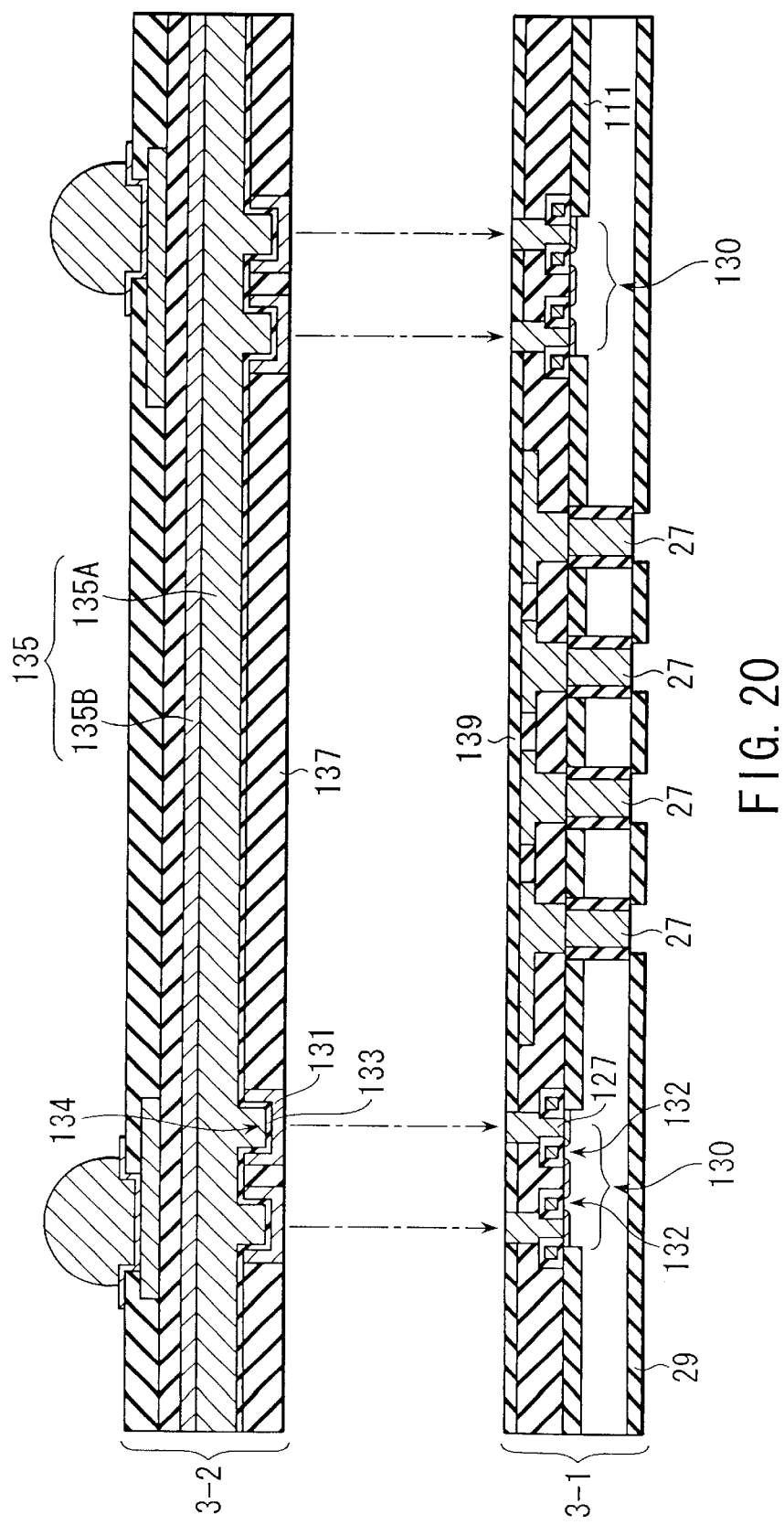
FIG. 20 is a cross-sectional view of an interposer (before connected) having a ferroelectric RAM and used in an LSI product according to a ninth embodiment.

FIG. 20 is a cross sectional view of the interposed used in the LSI product according to the ninth embodiment of the present invention.

As shown in FIG. 20, a cell transistor 132 of a ferroelectric RAM memory cell 130 is formed in an interposer 3-1. A ferroelectric capacitor 134 is formed in an interposer 3-2. The ferroelectric capacitor 134 is formed of a storage node electrode 131, a ferroelectric film 133 and a plate electrode 135. The storage node electrode 131 is formed of SRO (generally, SrRuO$_3$). The ferroelectric film 133 is formed of the BSTO film. The plate electrode 135 is formed of a stacked film of the SRO film 135A and the Al film 135B.

The storage node electrode 131 is formed in an opening portion formed in an interlayer insulating film 137 and exposed in the surface of the interposer 3-2. The surfaces of the storage node electrode 131 and the interlayer insulating film 137 are flattened by lapping or CMP.

The plug 127 is formed in an opening portion formed in an interlayer insulating film 139 and exposed in the surface of the interposer 3-1. The surfaces of the plug 127 and the interlayer insulating film 139 are flattened by lapping or CMP.

The exposed plug 127 and the exposed storage node electrode 131 are connected to each other in accordance with the connection method explained in the third and fourth embodiments. In this way, the ferroelectric RAM memory cell (ferroelectric memory cell) is formed of a stacked structure of the interposer 3-1 and the interposer 3-2.

As described above, in this embodiment, the interposer 3-2 having the BSTO film formed therein is separated from the interposer 3-1 having a transistor therein. Therefore, the BSTO film is not affected by the hydrogen annealing performed for improving the transistor characteristics. As a result, the BSTO film having a good quality can be obtained.

In the ninth embodiment, since the ferroelectric capacitor having the BSTO film is formed in the interposer 3-2, the number of manufacturing steps can be reduced in the same manner as in the eighth embodiment. Hence, the yield of the LSI chip can be improved. It is therefore possible to prevent an increase of the manufacturing cost of the LSI product.

In the ninth embodiment, the cell transistor is formed in the interposer 3-1. However the cell transistor may be formed in the LSI chip. It is desirable that only the BSTO film and wiring are formed in the interposer 3-2 without forming the transistor, to obtained a good-quality BSTO film, as shown in FIG. 20. This is because it is not necessary to apply the hydrogen annealing to the interposer 3-2 in which a transistor is not formed.

Tenth Embodiment

In the sixth embodiment, we will explain the system LSI chip 101 in which the ferroelectric RAM 102C, logic 102A and DRAM 102B are formed as shown in FIG. 17. In the tenth embodiment, the system LSI chip is the same as the system LSI chip 101 shown in FIG. 17 except that the ferroelectric RAM is replaced with a magnetic random access memory (Magnetic RAM).

Figure 21:
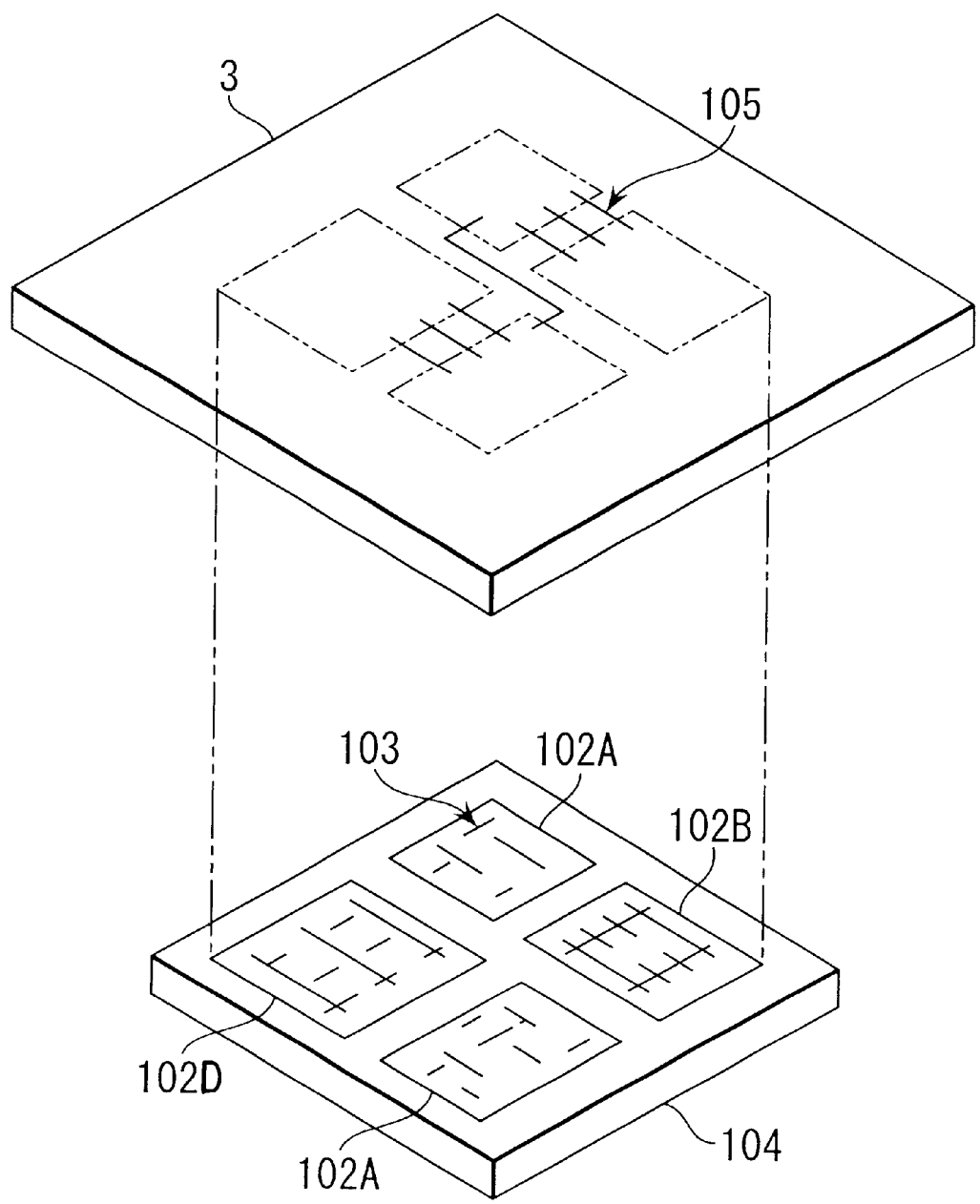
FIG. 21 is a perspective view schematically showing an LSI product according to a tenth embodiment of the present invention.

FIG. 21 is a perspective view schematically showing an LSI product according to the tenth embodiment of the present invention.

More specifically, FIG. 21 shows a system LSI product having a system LSI chip 104 and the interposer 3. In the system LSI chip 104, two logics 102A, a single DRAM 102B and a single magnetic RAM 102D are formed. An inner-block wiring 103 is formed in each of the logics 102A, the DRAM 102B and the Magnetic RAM 102D. An inter-block wiring 105 is formed in the interposer 3. The multi wiring layers constituting the inter-block wiring 105 may be formed in entirety and in part in the interposer as the same as in the fifth embodiment.

According to the tenth embodiment, it is possible to reduce the number of wiring layers in the system LSI chip 104. Usually when the number of wiring layers within the system LSI chip 104 increases, the yield is expected to be reduced with the result that the manufacturing cost may increase. However, in this embodiment, the number of wiring layers within the system LSI chip 104 is reduced. Therefore, it is possible to reduce the manufacturing cost. It is considered that this embodiment is useful in reducing manufacturing cost of the system LSI product.

Eleventh Embodiment

The eighth embodiment shows an integrated circuit (shown in FIG. 19) using an interposer 3 in which a ferroelectric RAM is formed. In the eleventh embodiment, an integrated circuit is formed in the same manner as in the eighth embodiment except that the ferroelectric RAM is replaced with a magnetic RAM.

Figure 22:
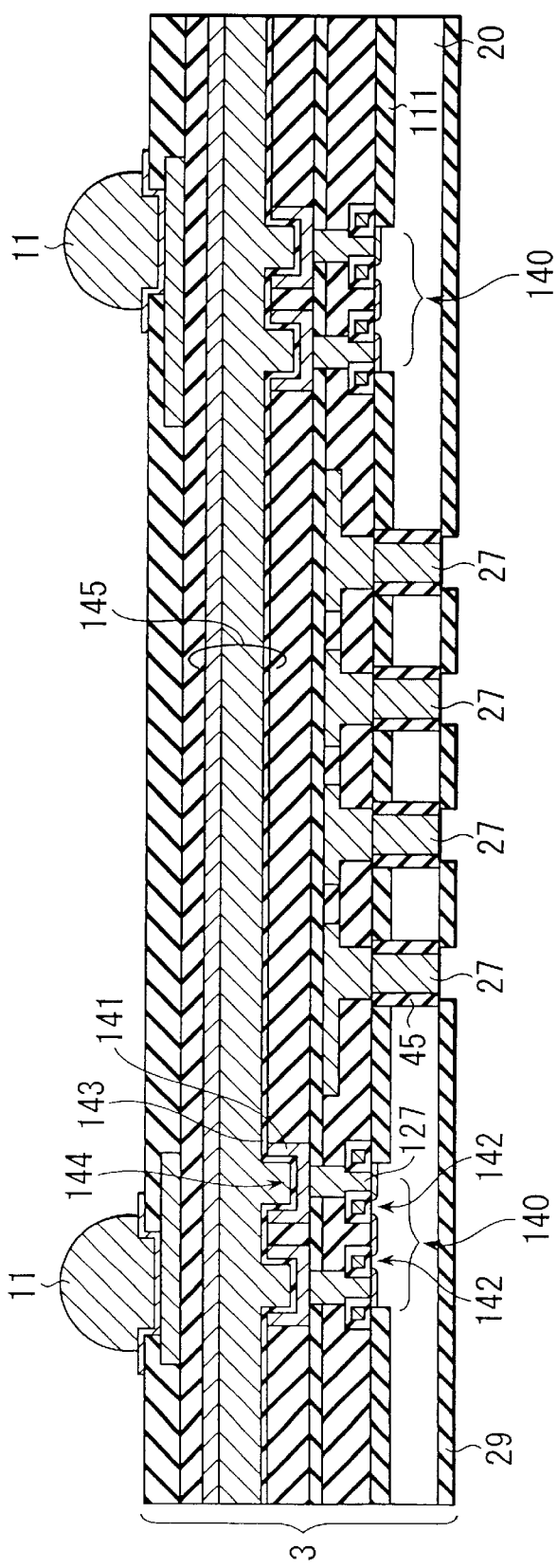
FIG. 22 is a cross-sectional view of an interposer having a magnetic RAM and used in an LSI product according to an eleventh embodiment.

FIG. 22 is a cross-sectional view of the interposer 3 having the magnetic RAM formed therein.

Of various circuits constituting the magnetic RAM, a circuit of a memory cell of the magnetic RAM is particularly shown in FIG. 22.

As shown in FIG. 22, the magnetic RAM memory cell 140 is constituted a cell transistor 142 and a magnetic capacitor 144 connected to a source or a drain of the cell transistor 142. The magnetic capacitor 144 is constituted of a storage node electrode 141, a magnetic film 143, and plate electrode 145. The magnetic film 143 is formed on the storage node electrode 141. The plate electrode 145 is formed on the magnetic film 143. FIG. 22 shows a stack type magnetic RAM memory cell 140 in which the magnetic capacitor 144 is arranged above the cell transistor 142. The storage node electrode 141 is connected to the source or drain of the cell transistor 142 via the plug 127.

In this embodiment, the magnetic RAM is formed in the interposer 3. Therefore, it is possible to reduce the number of steps for forming the system LSI chip. As a result, the yield can be improved.

Furthermore, the interposer 3 having the magnetic RAM formed therein is connected to the system LSI chip. It is therefore possible to form an LSI product having the same function as the system LSI chip and having the magnetic RAM formed therein while preventing an increase of the manufacturing cost.

As explained in the foregoing, according to the present invention, it is possible to provide a semiconductor integrated circuit device having a semiconductor integrated circuit chip and a package substrate on which the chip is to be mounted while preventing an increase of the manufacturing cost. Furthermore, it is possible to provide a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device having a circuit device which realizes a function, comprising:
    a semiconductor chip having a plurality of first pads arranged at first pitches on a surface thereof, said semiconductor chip being unable to unilaterally realize the function;
    an interposer having a first surface and a second surface, said first surface having a plurality of second pads arranged at the first pitches thereon and said second surface having a plurality of third pads arranged at second pitches which are larger than the first pitches, said interposer being unable to unilaterally realize the function; and
    a substrate having a plurality of fourth pads arranged at the second pitches on a surface thereof,
        wherein the second pads and the first pads are connected to each other by joining the first surface of the interposer to the surface of the semiconductor chip so as to face each other, thereby realizing the function; and
        the fourth pads and the third pads are connected to each other by joining the surface of the substrate to the second surface of the interposer so as to face each other.

2. The semiconductor integrated circuit device according to claim 1, wherein said interposer has a part of wiring layers.

3. The semiconductor integrated circuit device according to claim 1, wherein said interposer includes a material having the same thermal expansion coefficient as that of the semiconductor chip.

4. The semiconductor integrated circuit device according to claim 1, wherein said interposer includes the same material as that of the semiconductor chip.

5. The semiconductor integrated circuit device according to claim 1, wherein a size of the interposer is larger than that of the semiconductor chip.

6. The semiconductor integrated circuit device according to claim 1, wherein the interposer is formed of a multi-layered wiring structure in which a plurality of wiring layers, each insulated with an insulating film, are stacked on top of each other.

7. The semiconductor integrated circuit device according to claim 6, wherein the dielectric constant of the insulating film is 4 or less.

8. The semiconductor integrated circuit device according to claim 1, wherein the interposer has at least one of an active element and a passive element.

9. The semiconductor integrated circuit device according to claim 8, wherein said at least one of the active element and the passive element is formed of a ferroelectric film.

10. The semiconductor integrated circuit device according to claim 8, wherein at least one of the active element and the passive element is formed of a magnetic film.

11. The semiconductor integrated circuit device according to claim 1, wherein an input/output circuit is formed in the interposer.

12. The semiconductor integrated circuit device according to claim 1, wherein a ferroelectric RAM is formed in the interposer.

13. The semiconductor integrated circuit device according to claim 1, wherein a magnetic RAM is formed in the interposer.

14. A semiconductor integrated circuit device having a first circuit and a second circuit which realize a function, comprising:
    a semiconductor chip having the first circuit formed therein, the first circuit being
    an interposer having the second circuit formed therein, the second circuit being unable to unilaterally realize the function, said interposer includes a material having the same thermal expansion coefficient as that of the semiconductor chip; and
    a substrate on which the interposer is to be mounted,
        wherein said function is realized by mounting said semiconductor chip on the interposer and connecting the first circuit to the second circuit.

15. The semiconductor integrated circuit device according to claim 14, wherein said interposer includes the same material as that of the semiconductor chip.

16. The semiconductor integrated circuit device according to claim 14, wherein a size of the interposer is larger than that of the semiconductor chip.

17. The semiconductor integrated circuit device according to claim 14, wherein the interposer is formed of a multi-layered wiring structure in which a plurality of wiring layers, each insulated with an insulating film, are stacked on top of each other.

18. The semiconductor integrated circuit device according to claim 17, wherein the dielectric constant of the insulating film is 4 or less.

19. The semiconductor integrated circuit device according to claim 14, wherein the interposer has at least one of an active element and a passive element.

20. The semiconductor integrated circuit device according to claim 19, wherein at least one of the active element and the passive element is formed of a ferroelectric film.

21. The semiconductor integrated circuit device according to claim 19, wherein at least one of the active element and the passive element is formed of a magnetic film.

22. The semiconductor integrated circuit device according to claim 14, wherein an input/output circuit is formed in the interposer.

23. The semiconductor integrated circuit device according to claim 14, wherein a ferroelectric RAM is formed in the interposer.

24. The semiconductor integrated circuit device according to claim 14, wherein a magnetic RAM is formed in the interposer.

* * * * *

UNITED STATES PATENT AND TRADEMARK OFFICE
CERTIFICATE OF CORRECTION

PATENT NO. : 6,661,088 B1  
DATED : December 9, 2003  
INVENTOR(S) : Yoda et al.

It is certified that error appears in the above-identified patent and that said Letters Patent is hereby corrected as shown below:

<u>Column 16,</u>  
Line 21, after "circuit being" insert -- unable to unilaterally realize the function; --

Signed and Sealed this

Twenty-third Day of March, 2004

JON W. DUDAS  
*Acting Director of the United States Patent and Trademark Office*